US009711495B2

(12) United States Patent
Becker

(10) Patent No.: US 9,711,495 B2
(45) Date of Patent: Jul. 18, 2017

(54) OVERSIZED CONTACTS AND VIAS IN LAYOUT DEFINED BY LINEARLY CONSTRAINED TOPOLOGY

(71) Applicant: Tela Innovations, Inc., Los Gatos, CA (US)

(72) Inventor: Scott T. Becker, Scotts Valley, CA (US)

(73) Assignee: Tela Innovations, Inc., Los Gatos, CA (US)

( * ) Notice: Subject to any disclaimer, the term of this patent is extended or adjusted under 35 U.S.C. 154(b) by 0 days.

(21) Appl. No.: 15/243,886

(22) Filed: Aug. 22, 2016

(65) Prior Publication Data

US 2016/0358903 A1 Dec. 8, 2016

Related U.S. Application Data

(63) Continuation of application No. 14/987,723, filed on Jan. 4, 2016, now Pat. No. 9,425,145, which is a (Continued)

(51) Int. Cl.
*H01L 27/02* (2006.01)
*H01L 23/528* (2006.01)
(Continued)

(52) U.S. Cl.
CPC ........... *H01L 27/0207* (2013.01); *G03F 1/36* (2013.01); *H01L 21/76816* (2013.01);
(Continued)

(58) Field of Classification Search
CPC ........... H01L 27/0207; H01L 21/76816; H01L 21/76897
See application file for complete search history.

(56) References Cited

U.S. PATENT DOCUMENTS 4,069,493 A 1/1978 Bobenrieth
4,197,555 A 4/1980 Uehara et al.
(Continued)

FOREIGN PATENT DOCUMENTS

EP 0102644 7/1989
EP 0788166 8/1997
(Continued)

OTHER PUBLICATIONS

U.S. Appl. No. 60/625,342, Pileggi et al., May 25, 2006.
(Continued)

*Primary Examiner* — Peter Bradford
(74) *Attorney, Agent, or Firm* — Martine Penilla Group, LLP

(57) ABSTRACT

A rectangular-shaped interlevel connection layout structure is defined to electrically connect a first layout structure in a first chip level with a second layout structure in a second chip level. The rectangular-shaped interlevel connection layout structure is defined by an as-drawn cross-section having at least one dimension larger than a corresponding dimension of either the first layout structure, the second layout structure, or both the first and second layout structures. A dimension of the rectangular-shaped interlevel connection layout structure can exceed a normal maximum size in one direction in exchange for a reduced size in another direction. The rectangular-shaped interlevel connection layout structure can be placed in accordance with a gridpoint of a virtual grid defined by two perpendicular sets of virtual lines. Also, the first and/or second layout structures can be spatially oriented and/or placed in accordance with one or both of the two perpendicular sets of virtual lines.

23 Claims, 9 Drawing Sheets

Related U.S. Application Data continuation of application No. 12/466,335, filed on May 14, 2009, now Pat. No. 9,230,910, and a continuation-in-part of application No. 12/013,342, filed on Jan. 11, 2008, now Pat. No. 7,917,879, said application No. 12/466,335 is a continuation-in-part of application No. 12/212,562, filed on Sep. 17, 2008, now Pat. No. 7,842,975, which is a continuation of application No. 11/683,402, filed on Mar. 7, 2007, now Pat. No. 7,446,352.

(60) Provisional application No. 61/127,727, filed on May 14, 2008, provisional application No. 60/963,364, filed on Aug. 2, 2007, provisional application No. 60/972,394, filed on Sep. 14, 2007, provisional application No. 60/781,288, filed on Mar. 9, 2006.

(51) Int. Cl.
    *H01L 21/8234* (2006.01)
    *H01L 23/522* (2006.01)
    *H01L 27/088* (2006.01)
    *H01L 29/423* (2006.01)
    *G03F 1/36* (2012.01)
    *H01L 21/768* (2006.01)

(52) U.S. Cl.
    CPC ............ *H01L 21/76897* (2013.01); *H01L 21/823437* (2013.01); *H01L 21/823475* (2013.01); *H01L 23/528* (2013.01); *H01L 23/5226* (2013.01); *H01L 23/5283* (2013.01); *H01L 27/0203* (2013.01); *H01L 27/088* (2013.01); *H01L 29/42376* (2013.01); *H01L 2924/0002* (2013.01)

(56) References Cited

U.S. PATENT DOCUMENTS

| | | | |
|---|---|---|---|
| 4,417,161 A | 11/1983 | Uya |
| 4,424,460 A | 1/1984 | Best |
| 4,575,648 A | 3/1986 | Lee |
| 4,602,270 A | 7/1986 | Finegold |
| 4,613,940 A | 9/1986 | Shenton et al. |
| 4,657,628 A | 4/1987 | Holloway et al. |
| 4,682,202 A | 7/1987 | Tanizawa |
| 4,745,084 A | 5/1988 | Rowson et al. |
| 4,780,753 A | 10/1988 | Shinichi et al. |
| 4,801,986 A | 1/1989 | Chang et al. |
| 4,804,636 A | 2/1989 | Groover, III |
| 4,812,688 A | 3/1989 | Chu et al. |
| 4,884,115 A | 11/1989 | Michel et al. |
| 4,928,160 A | 5/1990 | Crafts |
| 4,975,756 A | 12/1990 | Haken et al. |
| 5,047,979 A | 9/1991 | Leung |
| 5,068,603 A | 11/1991 | Mahoney |
| 5,079,614 A | 1/1992 | Khatakhotan |
| 5,097,422 A | 3/1992 | Corbin et al. |
| 5,117,277 A | 5/1992 | Yuyama et al. |
| 5,121,186 A | 6/1992 | Wong et al. |
| 5,208,765 A | 5/1993 | Turnbull |
| 5,224,057 A | 6/1993 | Igarashi |
| 5,242,770 A | 9/1993 | Chen et al. |
| 5,268,319 A | 12/1993 | Harari |
| 5,298,774 A | 3/1994 | Ueda et al. |
| 5,313,426 A | 5/1994 | Sakuma et al. |
| 5,338,963 A | 8/1994 | Klaasen |
| 5,351,197 A | 9/1994 | Upton et al. |
| 5,359,226 A | 10/1994 | DeJong |
| 5,365,454 A | 11/1994 | Nakagawa et al. |
| 5,367,187 A | 11/1994 | Yuen |
| 5,378,649 A | 1/1995 | Huang |
| 5,396,128 A | 3/1995 | Dunning et al. |
| 5,420,447 A | 5/1995 | Waggoner |
| 5,461,577 A | 10/1995 | Shaw et al. |
| 5,471,403 A | 11/1995 | Fujimaga |
| 5,497,334 A | 3/1996 | Russell et al. |
| 5,497,337 A | 3/1996 | Ponnapalli et al. |
| 5,526,307 A | 6/1996 | Lin et al. |
| 5,536,955 A | 7/1996 | Ali |
| 5,545,904 A | 8/1996 | Orbach |
| 5,581,098 A | 12/1996 | Chang |
| 5,581,202 A | 12/1996 | Yano et al. |
| 5,612,893 A | 3/1997 | Hao et al. |
| 5,636,002 A | 6/1997 | Garofalo |
| 5,656,861 A | 8/1997 | Godinho et al. |
| 5,682,323 A | 10/1997 | Pasch et al. |
| 5,684,311 A | 11/1997 | Shaw |
| 5,684,733 A | 11/1997 | Wu et al. |
| 5,698,873 A | 12/1997 | Colwell et al. |
| 5,705,301 A | 1/1998 | Garza et al. |
| 5,723,883 A | 3/1998 | Gheewalla |
| 5,723,908 A | 3/1998 | Fuchida et al. |
| 5,740,068 A | 4/1998 | Liebmann et al. |
| 5,745,374 A | 4/1998 | Matsumoto |
| 5,754,826 A | 5/1998 | Gamal |
| 5,764,533 A | 6/1998 | deDood |
| 5,774,367 A | 6/1998 | Reyes et al. |
| 5,780,909 A | 7/1998 | Hayashi |
| 5,789,776 A | 8/1998 | Lancaster et al. |
| 5,790,417 A | 8/1998 | Chao et al. |
| 5,796,128 A | 8/1998 | Tran et al. |
| 5,796,624 A | 8/1998 | Sridhar et al. |
| 5,798,298 A | 8/1998 | Yang et al. |
| 5,814,844 A | 9/1998 | Nagata et al. |
| 5,825,203 A | 10/1998 | Kusunoki et al. |
| 5,834,851 A | 11/1998 | Ikeda et al. |
| 5,838,594 A | 11/1998 | Kojima |
| 5,841,663 A | 11/1998 | Sharma et al. |
| 5,847,421 A | 12/1998 | Yamaguchi |
| 5,850,362 A | 12/1998 | Sakuma et al. |
| 5,852,562 A | 12/1998 | Shinomiya et al. |
| 5,858,580 A | 1/1999 | Wang et al. |
| 5,898,194 A | 4/1999 | Gheewala |
| 5,900,340 A | 5/1999 | Reich et al. |
| 5,905,287 A | 5/1999 | Hirata |
| 5,908,827 A | 6/1999 | Sirna |
| 5,915,199 A | 6/1999 | Hsu |
| 5,917,207 A | 6/1999 | Colwell et al. |
| 5,920,486 A | 7/1999 | Beahm et al. |
| 5,923,059 A | 7/1999 | Gheewala |
| 5,923,060 A | 7/1999 | Gheewala |
| 5,929,469 A | 7/1999 | Mimoto et al. |
| 5,930,163 A | 7/1999 | Hara et al. |
| 5,935,763 A | 8/1999 | Caterer et al. |
| 5,949,101 A | 9/1999 | Aritome |
| 5,973,507 A | 10/1999 | Yamazaki |
| 5,977,305 A | 11/1999 | Wigler et al. |
| 5,977,574 A | 11/1999 | Schmitt et al. |
| 5,998,879 A | 12/1999 | Iwaki et al. |
| 6,009,251 A | 12/1999 | Ho et al. |
| 6,026,223 A | 2/2000 | Scepanovic et al. |
| 6,026,225 A | 2/2000 | Iwasaki |
| 6,037,613 A | 3/2000 | Mariyama |
| 6,037,617 A | 3/2000 | Kumagai |
| 6,044,007 A | 3/2000 | Capodicci |
| 6,054,872 A | 4/2000 | Fudanuki et al. |
| 6,063,132 A | 5/2000 | DeCamp et al. |
| 6,077,310 A | 6/2000 | Yamamoto et al. |
| 6,080,206 A | 6/2000 | Tadokoro et al. |
| 6,084,255 A | 7/2000 | Ueda |
| 6,084,437 A | 7/2000 | Sako |
| 6,091,845 A | 7/2000 | Pierrat et al. |
| 6,099,584 A | 8/2000 | Arnold et al. |
| 6,100,025 A | 8/2000 | Wigler et al. |
| 6,114,071 A | 9/2000 | Chen et al. |
| 6,144,227 A | 11/2000 | Sato |
| 6,159,839 A | 12/2000 | Jeng et al. |
| 6,166,415 A | 12/2000 | Sakemi et al. |
| 6,166,560 A | 12/2000 | Ogura et al. |
| 6,174,742 B1 | 1/2001 | Sudhindranath et al. |
| 6,182,272 B1 | 1/2001 | Andreev et al. |
| 6,194,104 B1 | 2/2001 | Hsu |

(56) References Cited

U.S. PATENT DOCUMENTS

| | | |
|---|---|---|
| 6,194,252 B1 | 2/2001 | Yamaguchi |
| 6,194,912 B1 | 2/2001 | Or-Bach |
| 6,209,123 B1 | 3/2001 | Maziasz et al. |
| 6,230,299 B1 | 5/2001 | McSherry et al. |
| 6,232,173 B1 | 5/2001 | Hsu et al. |
| 6,240,542 B1 | 5/2001 | Kapur |
| 6,249,902 B1 | 6/2001 | Igusa et al. |
| 6,255,600 B1 | 7/2001 | Schaper |
| 6,255,845 B1 | 7/2001 | Wong et al. |
| 6,262,487 B1 | 7/2001 | Igarashi et al. |
| 6,269,472 B1 | 7/2001 | Garza et al. |
| 6,275,973 B1 | 8/2001 | Wein |
| 6,282,696 B1 | 8/2001 | Garza et al. |
| 6,291,276 B1 | 9/2001 | Gonzalez |
| 6,297,668 B1 | 10/2001 | Schober |
| 6,297,674 B1 | 10/2001 | Kono et al. |
| 6,303,252 B1 | 10/2001 | Lin |
| 6,331,733 B1 | 12/2001 | Or-Bach et al. |
| 6,331,791 B1 | 12/2001 | Huang |
| 6,335,250 B1 | 1/2002 | Egi |
| 6,338,972 B1 | 1/2002 | Sudhindranath et al. |
| 6,347,062 B2 | 2/2002 | Nii et al. |
| 6,356,112 B1 | 3/2002 | Tran et al. |
| 6,359,804 B2 | 3/2002 | Kuriyama et al. |
| 6,370,679 B1 | 4/2002 | Chang et al. |
| 6,378,110 B1 | 4/2002 | Ho |
| 6,380,592 B2 | 4/2002 | Tooher et al. |
| 6,388,296 B1 | 5/2002 | Hsu |
| 6,393,601 B1 | 5/2002 | Tanaka et al. |
| 6,399,972 B1 | 6/2002 | Masuda et al. |
| 6,400,183 B2 | 6/2002 | Yamashita et al. |
| 6,408,427 B1 | 6/2002 | Cong et al. |
| 6,415,421 B2 | 7/2002 | Anderson et al. |
| 6,416,907 B1 | 7/2002 | Winder et al. |
| 6,417,549 B1 | 7/2002 | Oh |
| 6,421,820 B1 | 7/2002 | Mansfield et al. |
| 6,425,112 B1 | 7/2002 | Bula et al. |
| 6,425,117 B1 | 7/2002 | Pasch et al. |
| 6,426,269 B1 | 7/2002 | Haffner et al. |
| 6,436,805 B1 | 8/2002 | Trivedi |
| 6,445,049 B1 | 9/2002 | Iranmanesh |
| 6,445,065 B1 | 9/2002 | Gheewala et al. |
| 6,467,072 B1 | 10/2002 | Yang et al. |
| 6,469,328 B2 | 10/2002 | Yanai et al. |
| 6,470,489 B1 | 10/2002 | Chang et al. |
| 6,476,493 B2 | 11/2002 | Or-Bach et al. |
| 6,477,695 B1 | 11/2002 | Gandhi |
| 6,480,032 B1 | 11/2002 | Aksamit |
| 6,480,989 B2 | 11/2002 | Chan et al. |
| 6,492,066 B1 | 12/2002 | Capodieci et al. |
| 6,496,965 B1 | 12/2002 | van Ginneken et al. |
| 6,504,186 B2 | 1/2003 | Kanamoto et al. |
| 6,505,327 B2 | 1/2003 | Lin |
| 6,505,328 B1 | 1/2003 | van Ginneken et al. |
| 6,507,941 B1 | 1/2003 | Leung et al. |
| 6,509,952 B1 | 1/2003 | Govil et al. |
| 6,514,849 B1 | 2/2003 | Hui et al. |
| 6,516,459 B1 | 2/2003 | Sahouria |
| 6,523,156 B2 | 2/2003 | Cirit |
| 6,525,350 B1 | 2/2003 | Kinoshita et al. |
| 6,536,028 B1 | 3/2003 | Katsioulas et al. |
| 6,543,039 B1 | 4/2003 | Watanabe |
| 6,553,544 B2 | 4/2003 | Tanaka et al. |
| 6,553,559 B2 | 4/2003 | Liebmann et al. |
| 6,553,562 B2 | 4/2003 | Capodieci et al. |
| 6,566,720 B2 | 5/2003 | Aldrich |
| 6,570,234 B1 | 5/2003 | Gardner |
| 6,571,140 B1 | 5/2003 | Wewalaarachchi |
| 6,571,379 B2 | 5/2003 | Takayama |
| 6,574,786 B1 | 6/2003 | Pohlenz et al. |
| 6,578,190 B2 | 6/2003 | Ferguson et al. |
| 6,583,041 B1 | 6/2003 | Capodici |
| 6,588,005 B1 | 7/2003 | Kobayashi et al. |
| 6,590,289 B2 | 7/2003 | Shively |
| 6,591,207 B2 | 7/2003 | Naya et al. |
| 6,609,235 B2 | 8/2003 | Ramaswamy et al. |
| 6,610,607 B1 | 8/2003 | Armbrust et al. |
| 6,617,621 B1 | 9/2003 | Gheewala et al. |
| 6,620,561 B2 | 9/2003 | Winder et al. |
| 6,621,132 B2 | 9/2003 | Onishi et al. |
| 6,632,741 B1 | 10/2003 | Clevenger et al. |
| 6,633,182 B2 | 10/2003 | Pileggi et al. |
| 6,635,935 B2 | 10/2003 | Makino |
| 6,642,744 B2 | 11/2003 | Or-Bach et al. |
| 6,643,831 B2 | 11/2003 | Chang et al. |
| 6,650,014 B2 | 11/2003 | Kariyazaki |
| 6,661,041 B2 | 12/2003 | Keeth |
| 6,662,350 B2 | 12/2003 | Fried et al. |
| 6,664,587 B2 | 12/2003 | Guterman et al. |
| 6,673,638 B1 | 1/2004 | Bendik et al. |
| 6,677,649 B2 | 1/2004 | Minami et al. |
| 6,687,895 B2 | 2/2004 | Zhang |
| 6,690,206 B2 | 2/2004 | Rikino et al. |
| 6,691,297 B1 | 2/2004 | Misaka et al. |
| 6,700,405 B1 | 3/2004 | Hirairi |
| 6,703,170 B1 | 3/2004 | Pindo |
| 6,709,880 B2 | 3/2004 | Yamamoto et al. |
| 6,714,903 B1 | 3/2004 | Chu et al. |
| 6,732,334 B2 | 5/2004 | Nakatsuka |
| 6,732,338 B2 | 5/2004 | Crouse et al. |
| 6,732,344 B2 | 5/2004 | Sakamoto et al. |
| 6,734,506 B2 | 5/2004 | Oyamatsu |
| 6,737,199 B1 | 5/2004 | Hsieh |
| 6,737,318 B2 | 5/2004 | Murata et al. |
| 6,737,347 B1 | 5/2004 | Houston et al. |
| 6,745,372 B2 | 6/2004 | Cote et al. |
| 6,745,380 B2 | 6/2004 | Bodendorf et al. |
| 6,749,972 B2 | 6/2004 | Yu |
| 6,750,555 B2 | 6/2004 | Satomi et al. |
| 6,760,269 B2 | 7/2004 | Nakase et al. |
| 6,765,245 B2 | 7/2004 | Bansal |
| 6,777,138 B2 | 8/2004 | Pierrat et al. |
| 6,777,146 B1 | 8/2004 | Samuels |
| 6,787,823 B2 | 9/2004 | Shibutani |
| 6,789,244 B1 | 9/2004 | Dasasathyan et al. |
| 6,789,246 B1 | 9/2004 | Mohan et al. |
| 6,792,591 B2 | 9/2004 | Shi et al. |
| 6,792,593 B2 | 9/2004 | Takashima et al. |
| 6,794,677 B2 | 9/2004 | Tamaki et al. |
| 6,794,914 B2 | 9/2004 | Sani et al. |
| 6,795,332 B2 | 9/2004 | Yamaoka et al. |
| 6,795,358 B2 | 9/2004 | Tanaka et al. |
| 6,795,952 B1 | 9/2004 | Stine et al. |
| 6,795,953 B2 | 9/2004 | Bakarian et al. |
| 6,800,883 B2 | 10/2004 | Furuya et al. |
| 6,806,180 B2 | 10/2004 | Cho |
| 6,807,663 B2 | 10/2004 | Cote et al. |
| 6,809,399 B2 | 10/2004 | Ikeda et al. |
| 6,812,574 B2 | 11/2004 | Tomita et al. |
| 6,818,389 B2 | 11/2004 | Fritze et al. |
| 6,818,929 B2 | 11/2004 | Tsutsumi et al. |
| 6,819,136 B2 | 11/2004 | Or-Bach |
| 6,820,248 B1 | 11/2004 | Gan |
| 6,826,738 B2 | 11/2004 | Cadouri |
| 6,834,375 B1 | 12/2004 | Stine et al. |
| 6,835,991 B2 | 12/2004 | Pell, III |
| 6,841,880 B2 | 1/2005 | Matsumoto et al. |
| 6,850,854 B2 | 2/2005 | Naya et al. |
| 6,854,096 B2 | 2/2005 | Eaton et al. |
| 6,854,100 B1 | 2/2005 | Chuang et al. |
| 6,867,073 B1 | 3/2005 | Enquist |
| 6,871,338 B2 | 3/2005 | Yamauchi |
| 6,872,990 B1 | 3/2005 | Kang |
| 6,877,144 B1 | 4/2005 | Rittman et al. |
| 6,881,523 B2 | 4/2005 | Smith |
| 6,884,712 B2 | 4/2005 | Yelehanka et al. |
| 6,885,045 B2 | 4/2005 | Hidaka |
| 6,889,370 B1 | 5/2005 | Kerzman et al. |
| 6,897,517 B2 | 5/2005 | Houdt et al. |
| 6,897,536 B2 | 5/2005 | Nomura et al. |
| 6,898,770 B2 | 5/2005 | Boluki et al. |
| 6,904,582 B1 | 6/2005 | Rittman et al. |
| 6,918,104 B2 | 7/2005 | Pierrat et al. |
| 6,920,079 B2 | 7/2005 | Shibayama |

(56) References Cited

U.S. PATENT DOCUMENTS

| | | |
|---|---|---|
| 6,921,982 B2 | 7/2005 | Joshi et al. |
| 6,922,354 B2 | 7/2005 | Ishikura et al. |
| 6,924,560 B2 | 8/2005 | Wang et al. |
| 6,928,635 B2 | 8/2005 | Pramanik et al. |
| 6,931,617 B2 | 8/2005 | Sanie et al. |
| 6,953,956 B2 | 10/2005 | Or-Bach et al. |
| 6,954,918 B2 | 10/2005 | Houston |
| 6,957,402 B2 | 10/2005 | Templeton et al. |
| 6,968,527 B2 | 11/2005 | Pierrat |
| 6,974,978 B1 | 12/2005 | Possley |
| 6,977,856 B2 | 12/2005 | Tanaka et al. |
| 6,978,436 B2 | 12/2005 | Cote et al. |
| 6,978,437 B1 | 12/2005 | Rittman et al. |
| 6,980,211 B2 | 12/2005 | Lin et al. |
| 6,992,394 B2 | 1/2006 | Park |
| 6,992,925 B2 | 1/2006 | Peng |
| 6,993,741 B2 | 1/2006 | Liebmann et al. |
| 6,994,939 B1 | 2/2006 | Ghandehari et al. |
| 6,998,722 B2 | 2/2006 | Madurawe |
| 7,003,068 B2 | 2/2006 | Kushner et al. |
| 7,009,862 B2 | 3/2006 | Higeta et al. |
| 7,016,214 B2 | 3/2006 | Kawamata et al. |
| 7,022,559 B2 | 4/2006 | Barnak et al. |
| 7,028,285 B2 | 4/2006 | Cote et al. |
| 7,041,568 B2 | 5/2006 | Goldbach et al. |
| 7,052,972 B2 | 5/2006 | Sandhu et al. |
| 7,053,424 B2 | 5/2006 | Ono |
| 7,063,920 B2 | 6/2006 | Baba-Ali |
| 7,064,068 B2 | 6/2006 | Chou et al. |
| 7,065,731 B2 | 6/2006 | Jacques et al. |
| 7,079,413 B2 | 7/2006 | Tsukamoto et al. |
| 7,079,989 B2 | 7/2006 | Wimer |
| 7,093,208 B2 | 8/2006 | Williams et al. |
| 7,093,228 B2 | 8/2006 | Andreev et al. |
| 7,103,870 B2 | 9/2006 | Misaka et al. |
| 7,105,871 B2 | 9/2006 | Or-Bach et al. |
| 7,107,551 B1 | 9/2006 | de Dood et al. |
| 7,115,343 B2 | 10/2006 | Gordon et al. |
| 7,115,920 B2 | 10/2006 | Bernstein et al. |
| 7,120,882 B2 | 10/2006 | Kotani et al. |
| 7,124,386 B2 | 10/2006 | Smith et al. |
| 7,126,837 B1 | 10/2006 | Banachowicz et al. |
| 7,132,203 B2 | 11/2006 | Pierrat |
| 7,137,092 B2 | 11/2006 | Maeda |
| 7,141,853 B2 | 11/2006 | Campbell et al. |
| 7,143,380 B1 | 11/2006 | Anderson et al. |
| 7,149,999 B2 | 12/2006 | Kahng et al. |
| 7,152,215 B2 | 12/2006 | Smith et al. |
| 7,155,685 B2 | 12/2006 | Mori et al. |
| 7,155,689 B2 | 12/2006 | Pierrat et al. |
| 7,159,197 B2 | 1/2007 | Falbo et al. |
| 7,174,520 B2 | 2/2007 | White et al. |
| 7,175,940 B2 | 2/2007 | Laidig et al. |
| 7,176,508 B2 | 2/2007 | Joshi et al. |
| 7,177,215 B2 | 2/2007 | Tanaka et al. |
| 7,183,611 B2 | 2/2007 | Bhattacharyya |
| 7,185,294 B2 | 2/2007 | Zhang |
| 7,188,322 B2 | 3/2007 | Cohn et al. |
| 7,194,712 B2 | 3/2007 | Wu |
| 7,200,835 B2 | 4/2007 | Zhang et al. |
| 7,202,517 B2 | 4/2007 | Dixit et al. |
| 7,205,191 B2 | 4/2007 | Kobayashi |
| 7,208,794 B2 | 4/2007 | Hofmann et al. |
| 7,214,579 B2 | 5/2007 | Widdershoven et al. |
| 7,219,326 B2 | 5/2007 | Reed et al. |
| 7,221,031 B2 | 5/2007 | Ryoo et al. |
| 7,225,423 B2 | 5/2007 | Bhattacharya et al. |
| 7,227,183 B2 | 6/2007 | Donze et al. |
| 7,228,510 B2 | 6/2007 | Ono |
| 7,231,628 B2 | 6/2007 | Pack et al. |
| 7,235,424 B2 | 6/2007 | Chen et al. |
| 7,243,316 B2 | 7/2007 | White et al. |
| 7,252,909 B2 | 8/2007 | Shin et al. |
| 7,257,017 B2 | 8/2007 | Liaw |
| 7,264,990 B2 | 9/2007 | Rueckes et al. |
| 7,266,787 B2 | 9/2007 | Hughes et al. |
| 7,269,803 B2 | 9/2007 | Khakzadi et al. |
| 7,278,118 B2 | 10/2007 | Pileggi et al. |
| 7,279,727 B2 | 10/2007 | Ikoma et al. |
| 7,287,320 B2 | 10/2007 | Wang et al. |
| 7,294,534 B2 | 11/2007 | Iwaki |
| 7,302,651 B2 | 11/2007 | Allen et al. |
| 7,308,669 B2 | 12/2007 | Buehler et al. |
| 7,312,003 B2 | 12/2007 | Cote et al. |
| 7,315,994 B2 | 1/2008 | Aller et al. |
| 7,327,591 B2 | 2/2008 | Sadra et al. |
| 7,329,938 B2 | 2/2008 | Kinoshita |
| 7,329,953 B2 | 2/2008 | Tu |
| 7,335,966 B2 | 2/2008 | Ihme et al. |
| 7,337,421 B2 | 2/2008 | Kamat |
| 7,338,896 B2 | 3/2008 | Vanhaelemeersch et al. |
| 7,345,909 B2 | 3/2008 | Chang et al. |
| 7,346,885 B2 | 3/2008 | Semmler |
| 7,350,183 B2 | 3/2008 | Cui et al. |
| 7,353,492 B2 | 4/2008 | Gupta et al. |
| 7,358,131 B2 | 4/2008 | Bhattacharyya |
| 7,360,179 B2 | 4/2008 | Smith et al. |
| 7,360,198 B2 | 4/2008 | Rana et al. |
| 7,366,997 B1 | 4/2008 | Rahmat et al. |
| 7,367,008 B2 | 4/2008 | White et al. |
| 7,376,931 B2 | 5/2008 | Kokubun |
| 7,383,521 B2 | 6/2008 | Smith et al. |
| 7,397,260 B2 | 7/2008 | Chanda et al. |
| 7,400,627 B2 | 7/2008 | Wu et al. |
| 7,402,848 B2 | 7/2008 | Chang et al. |
| 7,404,154 B1 | 7/2008 | Venkatraman et al. |
| 7,404,173 B2 | 7/2008 | Wu et al. |
| 7,411,252 B2 | 8/2008 | Anderson et al. |
| 7,421,678 B2 | 9/2008 | Barnes et al. |
| 7,423,298 B2 | 9/2008 | Mariyama et al. |
| 7,424,694 B2 | 9/2008 | Ikeda |
| 7,424,695 B2 | 9/2008 | Tamura et al. |
| 7,424,696 B2 | 9/2008 | Vogel et al. |
| 7,426,710 B2 | 9/2008 | Zhang et al. |
| 7,432,562 B2 | 10/2008 | Bhattacharyya |
| 7,434,185 B2 | 10/2008 | Dooling et al. |
| 7,441,211 B1 | 10/2008 | Gupta et al. |
| 7,442,630 B2 | 10/2008 | Kelberlau et al. |
| 7,444,609 B2 | 10/2008 | Charlebois et al. |
| 7,446,352 B2 | 11/2008 | Becker et al. |
| 7,449,371 B2 | 11/2008 | Kemerling et al. |
| 7,458,045 B2 | 11/2008 | Cote et al. |
| 7,459,792 B2 | 12/2008 | Chen |
| 7,465,973 B2 | 12/2008 | Chang et al. |
| 7,466,607 B2 | 12/2008 | Hollis et al. |
| 7,469,396 B2 | 12/2008 | Hayashi et al. |
| 7,480,880 B2 | 1/2009 | Visweswariah et al. |
| 7,480,891 B2 | 1/2009 | Sezginer |
| 7,484,197 B2 | 1/2009 | Allen et al. |
| 7,485,934 B2 | 2/2009 | Liaw |
| 7,487,475 B1 | 2/2009 | Kriplani et al. |
| 7,492,013 B2 | 2/2009 | Correale, Jr. |
| 7,500,211 B2 | 3/2009 | Komaki |
| 7,502,275 B2 | 3/2009 | Nii et al. |
| 7,503,026 B2 | 3/2009 | Ichiryu et al. |
| 7,504,184 B2 | 3/2009 | Hung et al. |
| 7,506,300 B2 | 3/2009 | Sezginer et al. |
| 7,508,238 B2 | 3/2009 | Yamagami |
| 7,509,621 B2 | 3/2009 | Melvin, III |
| 7,509,622 B2 | 3/2009 | Sinha et al. |
| 7,512,017 B2 | 3/2009 | Chang |
| 7,512,921 B2 | 3/2009 | Shibuya |
| 7,514,355 B2 | 4/2009 | Katase |
| 7,514,959 B2 | 4/2009 | Or-Bach et al. |
| 7,523,429 B2 | 4/2009 | Kroyan et al. |
| 7,527,900 B2 | 5/2009 | Zhou et al. |
| 7,538,368 B2 | 5/2009 | Yano |
| 7,543,262 B2 | 6/2009 | Wang et al. |
| 7,563,701 B2 | 7/2009 | Chang et al. |
| 7,564,134 B2 | 7/2009 | Lee et al. |
| 7,568,174 B2 | 7/2009 | Sezginer et al. |
| 7,569,309 B2 | 8/2009 | Walter et al. |
| 7,569,310 B2 | 8/2009 | Wallace et al. |
| 7,569,894 B2 | 8/2009 | Suzuki |

(56) References Cited

U.S. PATENT DOCUMENTS

| | | |
|---|---|---|
| 7,575,973 B2 | 8/2009 | Mokhlesi et al. |
| 7,598,541 B2 | 10/2009 | Okamoto et al. |
| 7,598,558 B2 | 10/2009 | Hashimoto et al. |
| 7,614,030 B2 | 11/2009 | Hsu |
| 7,625,790 B2 | 12/2009 | Yang |
| 7,632,610 B2 | 12/2009 | Wallace et al. |
| 7,640,522 B2 | 12/2009 | Gupta et al. |
| 7,646,651 B2 | 1/2010 | Lee et al. |
| 7,653,884 B2 | 1/2010 | Furnish et al. |
| 7,665,051 B2 | 2/2010 | Ludwig et al. |
| 7,700,466 B2 | 4/2010 | Booth et al. |
| 7,712,056 B2 | 5/2010 | White et al. |
| 7,739,627 B2 | 6/2010 | Chew et al. |
| 7,749,662 B2 | 7/2010 | Matthew et al. |
| 7,755,110 B2 | 7/2010 | Gliese et al. |
| 7,770,144 B2 | 8/2010 | Dellinger |
| 7,781,847 B2 | 8/2010 | Yang |
| 7,791,109 B2 | 9/2010 | Wann et al. |
| 7,802,219 B2 | 9/2010 | Tomar et al. |
| 7,816,740 B2 | 10/2010 | Houston |
| 7,825,437 B2 | 11/2010 | Pillarisetty et al. |
| 7,842,975 B2 | 11/2010 | Becker et al. |
| 7,873,929 B2 | 1/2011 | Kahng et al. |
| 7,882,456 B2 | 2/2011 | Zach |
| 7,888,705 B2 | 2/2011 | Becker et al. |
| 7,898,040 B2 | 3/2011 | Nawaz |
| 7,906,801 B2 | 3/2011 | Becker et al. |
| 7,908,578 B2 | 3/2011 | Becker et al. |
| 7,910,958 B2 | 3/2011 | Becker et al. |
| 7,910,959 B2 | 3/2011 | Becker et al. |
| 7,917,877 B2 | 3/2011 | Singh et al. |
| 7,917,879 B2 | 3/2011 | Becker et al. |
| 7,923,266 B2 | 4/2011 | Thijs et al. |
| 7,923,337 B2 | 4/2011 | Chang et al. |
| 7,923,757 B2 | 4/2011 | Becker et al. |
| 7,926,001 B2 | 4/2011 | Pierrat |
| 7,932,544 B2 | 4/2011 | Becker et al. |
| 7,932,545 B2 | 4/2011 | Becker et al. |
| 7,934,184 B2 | 4/2011 | Zhang |
| 7,939,443 B2 | 5/2011 | Fox et al. |
| 7,943,966 B2 | 5/2011 | Becker et al. |
| 7,943,967 B2 | 5/2011 | Becker et al. |
| 7,948,012 B2 | 5/2011 | Becker et al. |
| 7,948,013 B2 | 5/2011 | Becker et al. |
| 7,952,119 B2 | 5/2011 | Becker et al. |
| 7,956,421 B2 | 6/2011 | Becker |
| 7,958,465 B2 | 6/2011 | Lu et al. |
| 7,962,867 B2 | 6/2011 | White et al. |
| 7,962,879 B2 | 6/2011 | Tang et al. |
| 7,964,267 B1 | 6/2011 | Lyons et al. |
| 7,971,160 B2 | 6/2011 | Osawa et al. |
| 7,989,847 B2 | 8/2011 | Becker et al. |
| 7,989,848 B2 | 8/2011 | Becker et al. |
| 7,992,122 B1 | 8/2011 | Burstein et al. |
| 7,994,583 B2 | 8/2011 | Inaba |
| 8,004,042 B2 | 8/2011 | Yang et al. |
| 8,022,441 B2 | 9/2011 | Becker et al. |
| 8,030,689 B2 | 10/2011 | Becker et al. |
| 8,035,133 B2 | 10/2011 | Becker et al. |
| 8,044,437 B1 | 10/2011 | Venkatraman et al. |
| 8,058,671 B2 | 11/2011 | Becker et al. |
| 8,058,690 B2 | 11/2011 | Chang |
| 8,072,003 B2 | 12/2011 | Becker et al. |
| 8,072,053 B2 | 12/2011 | Li |
| 8,088,679 B2 | 1/2012 | Becker et al. |
| 8,088,680 B2 | 1/2012 | Becker et al. |
| 8,088,681 B2 | 1/2012 | Becker et al. |
| 8,088,682 B2 | 1/2012 | Becker et al. |
| 8,089,098 B2 | 1/2012 | Becker et al. |
| 8,089,099 B2 | 1/2012 | Becker et al. |
| 8,089,100 B2 | 1/2012 | Becker et al. |
| 8,089,101 B2 | 1/2012 | Becker et al. |
| 8,089,102 B2 | 1/2012 | Becker et al. |
| 8,089,103 B2 | 1/2012 | Becker et al. |
| 8,089,104 B2 | 1/2012 | Becker et al. |
| 8,101,975 B2 | 1/2012 | Becker et al. |
| 8,110,854 B2 | 2/2012 | Becker et al. |
| 8,129,750 B2 | 3/2012 | Becker et al. |
| 8,129,751 B2 | 3/2012 | Becker et al. |
| 8,129,752 B2 | 3/2012 | Becker et al. |
| 8,129,754 B2 | 3/2012 | Becker et al. |
| 8,129,755 B2 | 3/2012 | Becker et al. |
| 8,129,756 B2 | 3/2012 | Becker et al. |
| 8,129,757 B2 | 3/2012 | Becker et al. |
| 8,129,819 B2 | 3/2012 | Becker et al. |
| 8,130,529 B2 | 3/2012 | Tanaka |
| 8,134,183 B2 | 3/2012 | Becker et al. |
| 8,134,184 B2 | 3/2012 | Becker et al. |
| 8,134,185 B2 | 3/2012 | Becker et al. |
| 8,134,186 B2 | 3/2012 | Becker et al. |
| 8,138,525 B2 | 3/2012 | Becker et al. |
| 8,161,427 B2 | 4/2012 | Morgenshtein et al. |
| 8,178,905 B2 | 5/2012 | Toubou |
| 8,178,909 B2 | 5/2012 | Venkatraman et al. |
| 8,198,656 B2 | 6/2012 | Becker et al. |
| 8,207,053 B2 | 6/2012 | Becker et al. |
| 8,214,778 B2 | 7/2012 | Quandt et al. |
| 8,217,428 B2 | 7/2012 | Becker et al. |
| 8,225,239 B2 | 7/2012 | Reed et al. |
| 8,225,261 B2 | 7/2012 | Hong et al. |
| 8,245,180 B2 | 8/2012 | Smayling et al. |
| 8,247,846 B2 | 8/2012 | Becker |
| 8,253,172 B2 | 8/2012 | Becker et al. |
| 8,253,173 B2 | 8/2012 | Becker et al. |
| 8,258,547 B2 | 9/2012 | Becker et al. |
| 8,258,548 B2 | 9/2012 | Becker et al. |
| 8,258,549 B2 | 9/2012 | Becker et al. |
| 8,258,550 B2 | 9/2012 | Becker et al. |
| 8,258,551 B2 | 9/2012 | Becker et al. |
| 8,258,552 B2 | 9/2012 | Becker et al. |
| 8,258,581 B2 | 9/2012 | Becker et al. |
| 8,264,007 B2 | 9/2012 | Becker et al. |
| 8,264,008 B2 | 9/2012 | Becker et al. |
| 8,264,009 B2 | 9/2012 | Becker et al. |
| 8,264,044 B2 | 9/2012 | Becker |
| 8,274,099 B2 | 9/2012 | Becker |
| 8,283,701 B2 | 10/2012 | Becker et al. |
| 8,294,212 B2 | 10/2012 | Wang et al. |
| 8,316,327 B2 | 11/2012 | Herold |
| 8,356,268 B2 | 1/2013 | Becker et al. |
| 8,363,455 B2 | 1/2013 | Rennie |
| 8,378,407 B2 | 2/2013 | Audzeyeu et al. |
| 8,395,224 B2 | 3/2013 | Becker et al. |
| 8,402,397 B2 | 3/2013 | Robles et al. |
| 8,405,163 B2 | 3/2013 | Becker et al. |
| 8,422,274 B2 | 4/2013 | Tomita et al. |
| 8,436,400 B2 | 5/2013 | Becker et al. |
| 8,453,094 B2 | 5/2013 | Kornachuk et al. |
| 8,575,706 B2 | 11/2013 | Becker et al. |
| 8,667,443 B2 | 3/2014 | Smayling et al. |
| 8,701,071 B2 | 4/2014 | Kornachuk et al. |
| 8,735,995 B2 | 5/2014 | Becker et al. |
| 8,756,551 B2 | 6/2014 | Becker et al. |
| 8,836,045 B2 | 9/2014 | Becker et al. |
| 8,839,162 B2 | 9/2014 | Amundson et al. |
| 8,839,175 B2 | 9/2014 | Smayling et al. |
| 8,847,329 B2 | 9/2014 | Becker et al. |
| 8,863,063 B2 | 10/2014 | Becker et al. |
| 9,006,841 B2 | 4/2015 | Kumar et al. |
| 9,035,359 B2 | 5/2015 | Becker |
| 9,202,779 B2 | 12/2015 | Kornachuk et al. |
| 9,269,423 B2 | 2/2016 | Sever |
| 9,336,344 B2 | 5/2016 | Smayling et al. |
| 9,443,947 B2 | 9/2016 | Becker |
| 2001/0049813 A1 | 12/2001 | Chan et al. |
| 2002/0003270 A1 | 1/2002 | Makino |
| 2002/0015899 A1 | 2/2002 | Chen et al. |
| 2002/0030510 A1 | 3/2002 | Kono et al. |
| 2002/0063582 A1 | 5/2002 | Rikino |
| 2002/0068423 A1 | 6/2002 | Park et al. |
| 2002/0079927 A1 | 6/2002 | Katoh et al. |
| 2002/0149392 A1 | 10/2002 | Cho |
| 2002/0166107 A1 | 11/2002 | Capodieci et al. |
| 2002/0194575 A1 | 12/2002 | Allen et al. |

(56) References Cited

U.S. PATENT DOCUMENTS

| | | |
|---|---|---|
| 2003/0042930 A1 | 3/2003 | Pileggi et al. |
| 2003/0046653 A1 | 3/2003 | Liu |
| 2003/0061592 A1 | 3/2003 | Agrawal et al. |
| 2003/0088839 A1 | 5/2003 | Watanabe |
| 2003/0088842 A1 | 5/2003 | Cirit |
| 2003/0103176 A1 | 6/2003 | Abe et al. |
| 2003/0106037 A1 | 6/2003 | Moniwa et al. |
| 2003/0117168 A1 | 6/2003 | Uneme et al. |
| 2003/0124847 A1 | 7/2003 | Houston et al. |
| 2003/0125917 A1 | 7/2003 | Rich et al. |
| 2003/0126569 A1 | 7/2003 | Rich et al. |
| 2003/0145288 A1 | 7/2003 | Wang et al. |
| 2003/0145299 A1 | 7/2003 | Fried et al. |
| 2003/0177465 A1 | 9/2003 | MacLean et al. |
| 2003/0185076 A1 | 10/2003 | Worley |
| 2003/0203287 A1 | 10/2003 | Miyagawa |
| 2003/0229868 A1 | 12/2003 | White et al. |
| 2003/0229875 A1 | 12/2003 | Smith et al. |
| 2004/0029372 A1 | 2/2004 | Jang et al. |
| 2004/0049754 A1 | 3/2004 | Liao et al. |
| 2004/0063038 A1 | 4/2004 | Shin et al. |
| 2004/0115539 A1 | 6/2004 | Broeke et al. |
| 2004/0139412 A1 | 7/2004 | Ito et al. |
| 2004/0145028 A1 | 7/2004 | Matsumoto et al. |
| 2004/0153979 A1 | 8/2004 | Chang |
| 2004/0161878 A1 | 8/2004 | Or-Bach et al. |
| 2004/0164360 A1 | 8/2004 | Nishida et al. |
| 2004/0169201 A1 | 9/2004 | Hidaka |
| 2004/0194050 A1 | 9/2004 | Hwang et al. |
| 2004/0196705 A1 | 10/2004 | Ishikura et al. |
| 2004/0229135 A1 | 11/2004 | Wang et al. |
| 2004/0232444 A1 | 11/2004 | Shimizu |
| 2004/0243966 A1 | 12/2004 | Dellinger |
| 2004/0262640 A1 | 12/2004 | Suga |
| 2005/0009312 A1 | 1/2005 | Butt et al. |
| 2005/0009344 A1 | 1/2005 | Hwang et al. |
| 2005/0012157 A1 | 1/2005 | Cho et al. |
| 2005/0044522 A1 | 2/2005 | Maeda |
| 2005/0055828 A1 | 3/2005 | Wang et al. |
| 2005/0076320 A1 | 4/2005 | Maeda |
| 2005/0087806 A1 | 4/2005 | Hokazono |
| 2005/0093147 A1 | 5/2005 | Tu |
| 2005/0101112 A1 | 5/2005 | Rueckes et al. |
| 2005/0110130 A1 | 5/2005 | Kitabayashi et al. |
| 2005/0135134 A1 | 6/2005 | Yen |
| 2005/0136340 A1 | 6/2005 | Baselmans et al. |
| 2005/0138598 A1 | 6/2005 | Kokubun |
| 2005/0156200 A1 | 7/2005 | Kinoshita |
| 2005/0185325 A1 | 8/2005 | Hur |
| 2005/0189604 A1 | 9/2005 | Gupta et al. |
| 2005/0189614 A1 | 9/2005 | Ihme et al. |
| 2005/0196685 A1 | 9/2005 | Wang et al. |
| 2005/0205894 A1 | 9/2005 | Sumikawa et al. |
| 2005/0212018 A1 | 9/2005 | Schoellkopf et al. |
| 2005/0224982 A1 | 10/2005 | Kemerling et al. |
| 2005/0229130 A1 | 10/2005 | Wu et al. |
| 2005/0251771 A1 | 11/2005 | Robles |
| 2005/0264320 A1 | 12/2005 | Chan et al. |
| 2005/0264324 A1 | 12/2005 | Nakazato |
| 2005/0266621 A1 | 12/2005 | Kim |
| 2005/0268256 A1 | 12/2005 | Tsai et al. |
| 2005/0278673 A1 | 12/2005 | Kawachi |
| 2005/0280031 A1 | 12/2005 | Yano |
| 2006/0036976 A1 | 2/2006 | Cohn |
| 2006/0038234 A1 | 2/2006 | Liaw |
| 2006/0063334 A1 | 3/2006 | Donze et al. |
| 2006/0070018 A1 | 3/2006 | Semmler |
| 2006/0084261 A1 | 4/2006 | Iwaki |
| 2006/0091550 A1 | 5/2006 | Shimazaki et al. |
| 2006/0095872 A1 | 5/2006 | McElvain |
| 2006/0101370 A1 | 5/2006 | Cui et al. |
| 2006/0112355 A1 | 5/2006 | Pileggi et al. |
| 2006/0113533 A1 | 6/2006 | Tamaki et al. |
| 2006/0113567 A1 | 6/2006 | Ohmori et al. |
| 2006/0120143 A1 | 6/2006 | Liaw |
| 2006/0121715 A1 | 6/2006 | Chang et al. |
| 2006/0123376 A1 | 6/2006 | Vogel et al. |
| 2006/0125024 A1 | 6/2006 | Ishigaki |
| 2006/0131609 A1 | 6/2006 | Kinoshita et al. |
| 2006/0136848 A1 | 6/2006 | Ichiryu et al. |
| 2006/0146638 A1 | 7/2006 | Chang et al. |
| 2006/0151810 A1 | 7/2006 | Ohshige |
| 2006/0158270 A1 | 7/2006 | Gibet et al. |
| 2006/0170108 A1 | 8/2006 | Hiroi |
| 2006/0177744 A1 | 8/2006 | Bodendorf et al. |
| 2006/0181310 A1 | 8/2006 | Rhee |
| 2006/0195809 A1 | 8/2006 | Cohn et al. |
| 2006/0195810 A1 | 8/2006 | Morton |
| 2006/0197557 A1 | 9/2006 | Chung |
| 2006/0206854 A1 | 9/2006 | Barnes et al. |
| 2006/0223302 A1 | 10/2006 | Chang et al. |
| 2006/0248495 A1 | 11/2006 | Sezginer |
| 2006/0261417 A1 | 11/2006 | Suzuki |
| 2006/0277521 A1 | 12/2006 | Chen |
| 2007/0001304 A1 | 1/2007 | Liaw |
| 2007/0002617 A1 | 1/2007 | Houston |
| 2007/0004147 A1 | 1/2007 | Toubou |
| 2007/0007574 A1 | 1/2007 | Ohsawa |
| 2007/0038973 A1 | 2/2007 | Li et al. |
| 2007/0074145 A1 | 3/2007 | Tanaka |
| 2007/0094634 A1 | 4/2007 | Seizginer et al. |
| 2007/0101305 A1 | 5/2007 | Smith et al. |
| 2007/0105023 A1 | 5/2007 | Zhou et al. |
| 2007/0106971 A1 | 5/2007 | Lien et al. |
| 2007/0113216 A1 | 5/2007 | Zhang |
| 2007/0172770 A1 | 7/2007 | Witters et al. |
| 2007/0186196 A1 | 8/2007 | Tanaka |
| 2007/0196958 A1 | 8/2007 | Bhattacharya et al. |
| 2007/0209029 A1 | 9/2007 | Ivonin et al. |
| 2007/0210391 A1 | 9/2007 | Becker et al. |
| 2007/0234252 A1 | 10/2007 | Visweswariah et al. |
| 2007/0234262 A1 | 10/2007 | Uedi et al. |
| 2007/0241810 A1 | 10/2007 | Onda |
| 2007/0256039 A1 | 11/2007 | White |
| 2007/0257277 A1 | 11/2007 | Takeda et al. |
| 2007/0264758 A1 | 11/2007 | Correale |
| 2007/0274140 A1 | 11/2007 | Joshi et al. |
| 2007/0277129 A1 | 11/2007 | Allen et al. |
| 2007/0288882 A1 | 12/2007 | Kniffin et al. |
| 2007/0290361 A1 | 12/2007 | Chen |
| 2007/0294652 A1 | 12/2007 | Bowen |
| 2007/0297249 A1 | 12/2007 | Chang et al. |
| 2008/0001176 A1 | 1/2008 | Gopalakrishnan |
| 2008/0005712 A1 | 1/2008 | Charlebois et al. |
| 2008/0021689 A1 | 1/2008 | Yamashita et al. |
| 2008/0022247 A1 | 1/2008 | Kojima et al. |
| 2008/0046846 A1 | 2/2008 | Chew et al. |
| 2008/0081472 A1 | 4/2008 | Tanaka |
| 2008/0082952 A1 | 4/2008 | O'Brien |
| 2008/0086712 A1 | 4/2008 | Fujimoto |
| 2008/0097641 A1 | 4/2008 | Miyashita et al. |
| 2008/0098334 A1 | 4/2008 | Pileggi et al. |
| 2008/0098341 A1 | 4/2008 | Kobayashi et al. |
| 2008/0099795 A1 | 5/2008 | Bernstein et al. |
| 2008/0127000 A1 | 5/2008 | Majumder et al. |
| 2008/0127029 A1 | 5/2008 | Graur et al. |
| 2008/0134128 A1 | 6/2008 | Blatchford et al. |
| 2008/0144361 A1 | 6/2008 | Wong |
| 2008/0148216 A1 | 6/2008 | Chan et al. |
| 2008/0163141 A1 | 7/2008 | Scheffer et al. |
| 2008/0168406 A1 | 7/2008 | Rahmat et al. |
| 2008/0169868 A1* | 7/2008 | Toubou ............... H01L 27/092 327/541 |
| 2008/0211028 A1 | 9/2008 | Suzuki |
| 2008/0216207 A1 | 9/2008 | Tsai |
| 2008/0244494 A1 | 10/2008 | McCullen |
| 2008/0251779 A1 | 10/2008 | Kakoschke et al. |
| 2008/0265290 A1 | 10/2008 | Nielsen et al. |
| 2008/0276105 A1 | 11/2008 | Hoberman et al. |
| 2008/0283910 A1 | 11/2008 | Dreeskornfeld et al. |
| 2008/0285331 A1 | 11/2008 | Torok et al. |
| 2008/0308848 A1 | 12/2008 | Inaba |
| 2008/0308880 A1 | 12/2008 | Inaba |
| 2008/0315258 A1 | 12/2008 | Masuda et al. |

(56) References Cited

U.S. PATENT DOCUMENTS

| | | |
|---|---|---|
| 2009/0014811 A1 | 1/2009 | Becker et al. |
| 2009/0024974 A1 | 1/2009 | Yamada |
| 2009/0031261 A1 | 1/2009 | Smith et al. |
| 2009/0032898 A1 | 2/2009 | Becker et al. |
| 2009/0032967 A1 | 2/2009 | Becker et al. |
| 2009/0037864 A1 | 2/2009 | Becker et al. |
| 2009/0057780 A1 | 3/2009 | Wong et al. |
| 2009/0075485 A1 | 3/2009 | Ban et al. |
| 2009/0077524 A1 | 3/2009 | Nagamura |
| 2009/0085067 A1 | 4/2009 | Hayashi et al. |
| 2009/0087991 A1 | 4/2009 | Yatsuda et al. |
| 2009/0101940 A1 | 4/2009 | Barrows et al. |
| 2009/0106714 A1 | 4/2009 | Culp et al. |
| 2009/0155990 A1 | 6/2009 | Yanagidaira et al. |
| 2009/0181314 A1 | 7/2009 | Shyu et al. |
| 2009/0187871 A1 | 7/2009 | Cork |
| 2009/0206443 A1 | 8/2009 | Juengling |
| 2009/0224408 A1 | 9/2009 | Fox |
| 2009/0228853 A1 | 9/2009 | Hong et al. |
| 2009/0228857 A1 | 9/2009 | Kornachuk et al. |
| 2009/0235215 A1 | 9/2009 | Lavin |
| 2009/0273100 A1 | 11/2009 | Aton et al. |
| 2009/0280582 A1 | 11/2009 | Thijs et al. |
| 2009/0283921 A1* | 11/2009 | Wang ............... H01L 21/76816 257/786 |
| 2009/0302372 A1 | 12/2009 | Chang et al. |
| 2009/0319977 A1 | 12/2009 | Saxena et al. |
| 2010/0001321 A1 | 1/2010 | Becker et al. |
| 2010/0006897 A1 | 1/2010 | Becker et al. |
| 2010/0006898 A1 | 1/2010 | Becker et al. |
| 2010/0006899 A1 | 1/2010 | Becker et al. |
| 2010/0006900 A1 | 1/2010 | Becker et al. |
| 2010/0006901 A1 | 1/2010 | Becker et al. |
| 2010/0006902 A1 | 1/2010 | Becker et al. |
| 2010/0006903 A1 | 1/2010 | Becker et al. |
| 2010/0006947 A1 | 1/2010 | Becker et al. |
| 2010/0006948 A1 | 1/2010 | Becker et al. |
| 2010/0006950 A1 | 1/2010 | Becker et al. |
| 2010/0006951 A1 | 1/2010 | Becker et al. |
| 2010/0006986 A1 | 1/2010 | Becker et al. |
| 2010/0011327 A1 | 1/2010 | Becker et al. |
| 2010/0011328 A1 | 1/2010 | Becker et al. |
| 2010/0011329 A1 | 1/2010 | Becker et al. |
| 2010/0011330 A1 | 1/2010 | Becker et al. |
| 2010/0011331 A1 | 1/2010 | Becker et al. |
| 2010/0011332 A1 | 1/2010 | Becker et al. |
| 2010/0011333 A1 | 1/2010 | Becker et al. |
| 2010/0012981 A1 | 1/2010 | Becker et al. |
| 2010/0012982 A1 | 1/2010 | Becker et al. |
| 2010/0012983 A1 | 1/2010 | Becker et al. |
| 2010/0012984 A1 | 1/2010 | Becker et al. |
| 2010/0012985 A1 | 1/2010 | Becker et al. |
| 2010/0012986 A1 | 1/2010 | Becker et al. |
| 2010/0017766 A1 | 1/2010 | Becker et al. |
| 2010/0017767 A1 | 1/2010 | Becker et al. |
| 2010/0017768 A1 | 1/2010 | Becker et al. |
| 2010/0017769 A1 | 1/2010 | Becker et al. |
| 2010/0017770 A1 | 1/2010 | Becker et al. |
| 2010/0017771 A1 | 1/2010 | Becker et al. |
| 2010/0017772 A1 | 1/2010 | Becker et al. |
| 2010/0019280 A1 | 1/2010 | Becker et al. |
| 2010/0019281 A1 | 1/2010 | Becker et al. |
| 2010/0019282 A1 | 1/2010 | Becker et al. |
| 2010/0019283 A1 | 1/2010 | Becker et al. |
| 2010/0019284 A1 | 1/2010 | Becker et al. |
| 2010/0019285 A1 | 1/2010 | Becker et al. |
| 2010/0019286 A1 | 1/2010 | Becker et al. |
| 2010/0019287 A1 | 1/2010 | Becker et al. |
| 2010/0019288 A1 | 1/2010 | Becker et al. |
| 2010/0019308 A1 | 1/2010 | Chan et al. |
| 2010/0023906 A1 | 1/2010 | Becker et al. |
| 2010/0023907 A1 | 1/2010 | Becker et al. |
| 2010/0023908 A1 | 1/2010 | Becker et al. |
| 2010/0023911 A1 | 1/2010 | Becker et al. |
| 2010/0025731 A1 | 2/2010 | Becker et al. |
| 2010/0025732 A1 | 2/2010 | Becker et al. |
| 2010/0025733 A1 | 2/2010 | Becker et al. |
| 2010/0025734 A1 | 2/2010 | Becker et al. |
| 2010/0025735 A1 | 2/2010 | Becker et al. |
| 2010/0025736 A1 | 2/2010 | Becker et al. |
| 2010/0032722 A1 | 2/2010 | Becker et al. |
| 2010/0032723 A1 | 2/2010 | Becker et al. |
| 2010/0032724 A1 | 2/2010 | Becker et al. |
| 2010/0032726 A1 | 2/2010 | Becker et al. |
| 2010/0037194 A1 | 2/2010 | Becker et al. |
| 2010/0037195 A1 | 2/2010 | Becker et al. |
| 2010/0096671 A1 | 4/2010 | Becker et al. |
| 2010/0115484 A1 | 5/2010 | Frederick |
| 2010/0203689 A1 | 8/2010 | Bernstein et al. |
| 2010/0224943 A1 | 9/2010 | Kawasaki |
| 2010/0229140 A1 | 9/2010 | Werner et al. |
| 2010/0232212 A1 | 9/2010 | Anderson et al. |
| 2010/0252865 A1 | 10/2010 | Van Der Zanden |
| 2010/0252896 A1 | 10/2010 | Smayling |
| 2010/0264468 A1 | 10/2010 | Xu |
| 2010/0270681 A1 | 10/2010 | Bird et al. |
| 2010/0287518 A1 | 11/2010 | Becker |
| 2010/0301482 A1 | 12/2010 | Schultz et al. |
| 2011/0016909 A1 | 1/2011 | Mirza et al. |
| 2011/0108890 A1 | 5/2011 | Becker et al. |
| 2011/0108891 A1 | 5/2011 | Becker et al. |
| 2011/0154281 A1 | 6/2011 | Zach |
| 2011/0207298 A1 | 8/2011 | Anderson et al. |
| 2011/0260253 A1 | 10/2011 | Inaba |
| 2011/0298025 A1 | 12/2011 | Haensch et al. |
| 2011/0317477 A1 | 12/2011 | Liaw |
| 2012/0012932 A1 | 1/2012 | Perng et al. |
| 2012/0118854 A1 | 5/2012 | Smayling |
| 2012/0131528 A1 | 5/2012 | Chen |
| 2012/0273841 A1 | 11/2012 | Quandt et al. |
| 2013/0097574 A1 | 4/2013 | Balabanov et al. |
| 2013/0200465 A1 | 8/2013 | Becker et al. |
| 2013/0200469 A1 | 8/2013 | Becker et al. |
| 2013/0207198 A1 | 8/2013 | Becker et al. |
| 2013/0207199 A1 | 8/2013 | Becker et al. |
| 2013/0254732 A1 | 9/2013 | Kornachuk et al. |
| 2014/0197543 A1 | 7/2014 | Kornachuk et al. |
| 2015/0249041 A1 | 9/2015 | Becker et al. |
| 2015/0270218 A1 | 9/2015 | Becker et al. |
| 2016/0079159 A1 | 3/2016 | Kornachuk et al. |

FOREIGN PATENT DOCUMENTS

| | | |
|---|---|---|
| EP | 1394858 | 3/2004 |
| EP | 1670062 | 6/2006 |
| EP | 1833091 | 8/2007 |
| EP | 1730777 | 9/2007 |
| EP | 2251901 | 11/2010 |
| FR | 2860920 | 4/2005 |
| JP | 58-182242 | 10/1983 |
| JP | 58-215827 | 12/1983 |
| JP | 61-182244 | 8/1986 |
| JP | S63-310136 A | 12/1988 |
| JP | H01284115 | 11/1989 |
| JP | 03-165061 | 7/1991 |
| JP | H05152937 A | 6/1993 |
| JP | H05211437 | 8/1993 |
| JP | H05218362 | 8/1993 |
| JP | H07-153927 A | 6/1995 |
| JP | 2684980 | 7/1995 |
| JP | 1995-302706 | 11/1995 |
| JP | 09-282349 | 10/1997 |
| JP | 1997-09289251 A | 11/1997 |
| JP | 10-116911 | 5/1998 |
| JP | 1999-045948 | 2/1999 |
| JP | 2001-068558 | 3/2001 |
| JP | 2001-168707 | 6/2001 |
| JP | 2002-026125 | 1/2002 |
| JP | 2002-026296 A | 1/2002 |
| JP | 2002-184870 A | 6/2002 |
| JP | 2001-056463 | 9/2002 |
| JP | 2002-258463 | 9/2002 |
| JP | 2002-289703 | 10/2002 |
| JP | 2001-272228 | 3/2003 |

(56) References Cited

FOREIGN PATENT DOCUMENTS

| | | |
|---|---|---|
| JP | 2003-100872 | 4/2003 |
| JP | 2003-264231 | 9/2003 |
| JP | 2004-013920 | 1/2004 |
| JP | 2004-200300 | 7/2004 |
| JP | 2004-241529 | 8/2004 |
| JP | 2004-342757 A | 12/2004 |
| JP | 2005-020008 | 1/2005 |
| JP | 2005-114752 | 4/2005 |
| JP | 2003-359375 | 5/2005 |
| JP | 2005-123537 | 5/2005 |
| JP | 2005-135971 A | 5/2005 |
| JP | 2005-149265 | 6/2005 |
| JP | 2005-183793 | 7/2005 |
| JP | 2005-203447 | 7/2005 |
| JP | 2005-268610 | 9/2005 |
| JP | 2006-073696 | 3/2006 |
| JP | 2006-303022 A | 11/2006 |
| JP | 2007-012855 | 1/2007 |
| JP | 2007-013060 | 1/2007 |
| JP | 2007-043049 | 2/2007 |
| JP | 2007-141971 | 6/2007 |
| JP | 2011-515841 | 5/2011 |
| KR | 10-0417093 | 6/1997 |
| KR | 10-1998-087485 | 12/1998 |
| KR | 1998-0084215 A | 12/1998 |
| KR | 10-1999-0057943 A | 7/1999 |
| KR | 2000-0005660 | 1/2000 |
| KR | 10-2000-0028830 A | 5/2000 |
| KR | 10-2002-0034313 | 5/2002 |
| KR | 10-2002-0070777 | 9/2002 |
| KR | 2003-0022006 | 3/2003 |
| KR | 2004-0005609 | 1/2004 |
| KR | 10-2005-0030347 A | 3/2005 |
| KR | 2005-0037965 A | 4/2005 |
| KR | 2006-0108233 A | 10/2006 |
| TW | 386288 | 4/2000 |
| TW | 200709309 | 3/2007 |
| TW | 200709565 | 3/2007 |
| TW | 200811704 A | 3/2008 |
| WO | WO 2005/104356 | 11/2005 |
| WO | WO 2006/014849 | 2/2006 |
| WO | WO 2006/052738 | 5/2006 |
| WO | WO 2006/090445 | 8/2006 |
| WO | WO 2007/014053 | 2/2007 |
| WO | WO 2007/103587 | 9/2007 |
| WO | WO 2009/054936 | 4/2009 |

OTHER PUBLICATIONS

Acar, et al., "A Linear-Centric Simulation Framework for Parametric Fluctuations", 2002, IEEE, Carnegie Mellon University USA, pp. 1-8, Jan. 28, 2002.
Amazawa, et al., "Fully Planarized Four-Level Interconnection with Stacked VLAS Using CMP of Selective CVD-Al and Insulator and its Application to Quarter Micron Gate Array LSIs", 1995, IEEE, Japan, pp. 473-476, Dec. 10, 1995.
Axelrad et al. "Efficient Full-Chip Yield Analysis Methodology for OPC-Corrected VLSI Design", 2000, International Symposium on Quality Electronic Design (ISQED), Mar. 20, 2000.
Balasinski et al. "Impact of Subwavelength CD Tolerance on Device Performance", 2002, SPIE vol. 4692, Jul. 11, 2002.
Burkhardt, et al., "Dark Field Double Dipole Lithography (DDL) for Back-End-Of-Line Processes", 2007, SPIE Proceeding Series, vol. 6520; Mar. 26, 2007.
Capetti, et al., "Sub k1=0.25 Lithography with Double Patterning Technique for 45nm Technology Node Flash Memory Devices at λ=193nm", 2007, SPIE Proceeding Series, vol. 6520; Mar. 27, 2007.
Capodieci, L., et al., "Toward a Methodology for Manufacturability-Driven Design Rule Exploration," DAC 2004, Jun. 7, 2004, San Diego, CA.

Chandra, et al., "An Interconnect Channel Design Methodology for High Performance Integrated Circuits", 2004, IEEE, Carnegie Mellon University, pp. 1-6, Feb. 16, 2004.
Cheng, et al., "Feasibility Study of Splitting Pitch Technology on 45nm Contact Patterning with 0.93 NA", 2007, SPIE Proceeding Series, vol. 6520; Feb. 25, 2007.
Chow, et al., "The Design of a SRAM-Based Field-Programmable Gate Array—Part II: Circuit Design and Layout", 1999, IEEE, vol. 7 # 3 pp. 321-330, Sep. 1, 1999.
Clark et al. "Managing Standby and Active Mode Leakage Power in Deep Sub-Micron Design", Aug. 9, 2004, ACM.
Cobb et al. "Using OPC to Optimize for Image Slope and Improve Process Window", 2003, SPIE vol. 5130, Apr. 16, 2003.
Devgan "Leakage Issues in IC Design: Part 3", 2003, ICCAD, Nov. 9, 2003.
DeVor, et al., "Statistical Quality Design and Control", 1992, Macmillan Publishing Company, pp. 264-267, Jan. 3, 1992.
Dictionary.com, "channel," in Collins English Dictionary—Complete & Unabridged 10th Edition. Source location: HarperCollins Publishers. Sep. 3, 2009.
Dusa, et al. "Pitch Doubling Through Dual Patterning Lithography Challenges in Integration and Litho Budgets", 2007, SPIE Proceeding Series, vol. 6520; Feb. 25, 2007.
El-Gamal, "Fast, Cheap and Under Control: The Next Implementation Fabric", Jun. 2, 2003, ACM Press, pp. 354-355.
Firedberg, et al., "Modeling Within-Field Gate Length Spatial Variation for Process-Design Co-Optimization," 2005 Proc. of SPIE vol. 5756, pp. 178-188, Feb. 27, 2005.
Frankel, "Quantum State Control Interference Lithography and Trim Double Patterning for 32-16nm Lithography", 2007, SPIE Proceeding Series, vol. 6520; Feb. 27, 2007.
Garg, et al. "Lithography Driven Layout Design", 2005, IEEE VLSI Design 2005, Jan. 3, 2005.
Grobman et al. "Reticle Enhancement Technology Trends: Resource and Manufacturability Implications for the Implementation of Physical Designs" Apr. 1, 2001, ACM.
Grobman et al. "Reticle Enhancement Technology: Implications and Challenges for Physical Design" Jun. 18, 2001, ACM.
Gupta et al. "Enhanced Resist and Etch CD Control by Design Perturbation", Oct. 4, 2006, Society of Photo-Optical Instrumentation Engineers.
Gupta et al. "A Practical Transistor-Level Dual Threshold Voltage Assignment Methodology", 2005, Sixth International Symposium on Quality Electronic Design (ISQED), Mar. 21, 2005.
Gupta et al. "Detailed Placement for Improved Depth of Focus and CD Control", 2005, ACM, Jan. 18, 2005.
Gupta et al. "Joining the Design and Mask Flows for Better and Cheaper Masks", Oct. 14, 2004, Society of Photo-Optical Instrumentation Engineers.
Gupta et al. "Manufacturing-Aware Physical Design", ICCAD 2003, Nov. 9, 2003.
Gupta et al. "Selective Gate-Length Biasing for Cost-Effective Runtime Leakage Control", Jun. 7, 2004, ACM.
Gupta et al. "Wafer Topography-Aware Optical Proximity Correction for Better DOF Margin and CD Control", Apr. 13, 2005, SPIE.
Gupta, Puneet, et al., "Manufacturing-aware Design Methodology for Assist Feature Correctness," SPIE vol. 5756, May 13, 2005.
Ha et al., "Reduction in the Mask Error Factor by Optimizing the Diffraction Order of a Scattering Bar in Lithography," Journal of the Korean Physical Society, vol. 46, No. 5, May 5, 2005, pp. 1213-1217.
Hakko, et al., "Extension of the 2D-TCC Technique to Optimize Mask Pattern Layouts," 2008 Proc. of SPIE vol. 7028, 11 pages, Apr. 16, 2008.
Halpin et al., "Detailed Placement with Net Length Constraints," Publication Year 2003, Proceedings of the 3rd IEEE International Workshop on System-on-Chip for Real-Time Applications, pp. 22-27, Jun. 30, 2003.
Hayashida, et al., "Manufacturable Local Interconnect technology Fully Compatible with Titanium Salicide Process", Jun. 11, 1991, VMIC Conference.

(56) References Cited

OTHER PUBLICATIONS

Heng, et al., "A VLSI Artwork Legalization Technique Base on a New Criterion of Minimum Layout Perturbation", Proceedings of 1997 International Symposium on Physical Design, pp. 116-121, Apr. 14, 1997.
Heng, et al., "Toward Through-Process Layout Quality Metrics", Mar. 3, 2005, Society of Photo-Optical Instrumentation Engineers.
Hu, et al., "Synthesis and Placement Flow for Gain-Based Programmable Regular Fabrics", Apr. 6, 2003, ACM Press, pp. 197-203.
Hur et al., "Mongrel: Hybrid Techniques for Standard Cell Placement," Publication Year 2000, IEEE/ACM International Conference on Computer Aided Design, ICCAD-2000, pp. 165-170, Nov. 5, 2000.
Hutton, et al., "A Methodology for FPGA to Structured-ASIC Synthesis and Verification", 2006, EDAA, pp. 64-69, Mar. 6, 2006.
INTEL Core Microarchitecture White Paper "Introducing the 45 nm Next-Generation Intel Core Microarchitecture," Intel Corporation, 2007 (best available publication date).
Jayakumar, et al., "A Metal and VIA Maskset Programmable VLSI Design Methodology using PLAs", 2004, IEEE, pp. 590-594, Nov. 7, 2004.
Jhaveri, T. et al., Maximization of Layout Printability/Manufacturability by Extreme Layout Regularity, Proc. of the SPIE vol. 6156, Feb. 19, 2006.
Kang, S.M., Metal-Metal Matrix (M3) for High-Speed MOS VLSI Layout, IEEE Trans. on CAD, vol. CAD-6, No. 5, Sep. 1, 1987.
Kawashima, et al., "Mask Optimization for Arbitrary Patterns with 2D-TCC Resolution Enhancement Technique," 2008 Proc. of SPIE vol. 6924, 12 pages, Feb. 24, 2008.
Kheterpal, et al., "Design Methodology for IC Manufacturability Based on Regular Logic-Bricks", DAC, Jun. 13, 2005, IEEE/AMC, vol. 6520.
Kheterpal, et al., "Routing Architecture Exploration for Regular Fabrics", DAC, Jun. 7, 2004, ACM Press, pp. 204-207.
Kim, et al., "Double Exposure Using 193nm Negative Tone Photoresist", 2007, SPIE Proceeding Series, vol. 6520; Feb. 25, 2007.
Kim, et al., "Issues and Challenges of Double Patterning Lithography in DRAM", 2007, SPIE Proceeding Series, vol. 6520; Feb. 25, 2007.
Koorapaty, et al., "Exploring Logic Block Granularity for Regular Fabrics", 2004, IEEE, pp. 1-6, Feb. 16, 2004.
Koorapaty, et al., "Heterogeneous Logic Block Architectures for Via-Patterned Programmable Fabric", 13th International Conference on Field Programmable Logic and Applications (FPL) 2003, Lecture Notes in Computer Science (LNCS), Sep. 1, 2003, Springer-Verlag, vol. 2778, pp. 426-436.
Koorapaty, et al., "Modular, Fabric-Specific Synthesis for Programmable Architectures", 12th International Conference on Field Programmable Logic and Applications (FPL_2002, Lecture Notes in Computer Science (LNCS)), Sep. 2, 2002, Springer-Verlag, vol. 2438 pp. 132-141.
Kuh et al., "Recent Advances in VLSI Layout," Proceedings of the IEEE, vol. 78, Issue 2, pp. 237-263, Feb. 1, 1990.
Lavin et al. "Backend DAC Flows for "Restrictive Design Rules"", 2004, IEEE, Nov. 7, 2004.
Li, et al., "A Linear-Centric Modeling Approach to Harmonic Balance Analysis", 2002, IEEE, pp. 1-6, Mar. 4, 2002.
Li, et al., "Nonlinear Distortion Analysis Via Linear-Centric Models", 2003, IEEE, pp. 897-903, Jan. 21, 2003.
Liebmann et al., "Integrating DfM Components into a Cohesive Design-to-Silicon Solution," Proc. SPIE 5756, Design and Process Integration for Microelectronic Manufacturing III, Feb. 27, 2005.
Liebmann et al., "Optimizing Style Options for Sub-Resolution Assist Features," Proc. of SPIE vol. 4346, Feb. 25, 2001, pp. 141-152.
Liebmann, et al., "High-Performance Circuit Design for the RET-Enabled 65nm Technology Node", Feb. 26, 2004, SPIE Proceeding Series, vol. 5379 pp. 20-29.

Liebmann, L. W., Layout Impact of Resolution Enhancement Techniques: Impediment or Opportunity?, International Symposium on Physical Design, Apr. 6, 2003.
Liu et al., "Double Patterning with Multilayer Hard Mask Shrinkage for Sub 0.25 k1 Lithography," Proc. SPIE 6520, Optical Microlithography XX, Feb. 25, 2007.
Mansfield et al., "Lithographic Comparison of Assist Feature Design Strategies," Proc. of SPIE vol. 4000, Feb. 27, 2000, pp. 63-76.
Miller, "Manufacturing-Aware Design Helps Boost IC Yield", Sep. 9, 2004, http://www.eetimes.com/showArticle.jhtml?articleID=47102054.
Mishra, P., et al., "FinFET Circuit Design," Nanoelectronic Circuit Design, pp. 23-54, Dec. 21, 2010.
Mo, et al., "Checkerboard: A Regular Structure and its Synthesis, International Workshop on Logic and Synthesis", Department of Electrical Engineering and Computer Sciences, UC Berkeley, California, pp. 1-7, Jun. 1, 2003.
Mo, et al., "PLA-Based Regular Structures and Their Synthesis", Department of Electrical Engineering and Computer Sciences, IEEE, pp. 723-729, Jun. 1, 2003.
Mo, et al., "Regular Fabrics in Deep Sub-Micron Integrated-Circuit Design", Kluwer Academic Publishers, Entire Book, Jun. 1, 2002.
Moore, Samuel K., "Intel 45-nanometer Penryn Processors Arrive," Nov. 13, 2007, IEEE Spectrum, http://spectrum.ieee.org/semiconductors/design/intel-45nanometer-penryn-processors-arrive.
Mutoh et al. "1-V Power Supply High-Speed Digital Circuit Technology with Multithreshold-Voltage CMOS", 1995, IEEE, Aug. 1, 1995.
Op de Beek, et al., "Manufacturability issues with Double Patterning for 50nm half pitch damascene applications, using RELACS® shrink and corresponding OPC", 2007, SPIE Proceeding Series, vol. 6520; Feb. 25, 2007.
Or-Bach, "Programmable Circuit Fabrics", Sep. 18, 2001, e-ASIC, pp. 1-36.
Otten, et al., "Planning for Performance", DAC 1998, ACM Inc., pp. 122-127, Jun. 15, 1998.
Pack et al. "Physical & Timing Verification of Subwavelength-Scale Designs—Part I: Lithography Impact on MOSFETs", 2003, SPIE vol. 5042, Feb. 23, 2003.
Pandini, et al., "Congestion-Aware Logic Synthesis", 2002, IEEE, pp. 1-8, Mar. 4, 2002.
Pandini, et al., "Understanding and Addressing the Impact of Wiring Congestion During Technology Mapping", ISPD Apr. 7, 2002, ACM Press, pp. 131-136.
Patel, et al., "An Architectural Exploration of Via Patterned Gate Arrays, ISPD 2003", Apr. 6, 2003, pp. 184-189.
Pham, D., et al., "FINFET Device Junction Formation Challenges," 2006 International Workshop on Junction Technology, pp. 73-77, Aug. 1, 2006.
Pileggi, et al., "Exploring Regular Fabrics to Optimize the Performance-Cost Trade-Offs, Proceedings of the 40th ACM/IEEE Design Automation Conference (DAC) 2003", Jun. 2, 2003, ACM Press, pp. 782-787.
Poonawala, et al., "ILT for Double Exposure Lithography with Conventional and Novel Materials", 2007, SPIE Proceeding Series, vol. 6520; Feb. 25, 2007.
Qian et al. "Advanced Physical Models for Mask Data Verification and Impacts on Physical Layout Synthesis" 2003 IEEE, Mar. 24, 2003.
Ran, et al., "An Integrated Design Flow for a Via-Configurable Gate Array", 2004, IEEE, pp. 582-589, Nov. 7, 2004.
Ran, et al., "Designing a Via-Configurable Regular Fabric", Custom Integrated Circuits Conference (CICC). Proceedings of the IEEE, Oct. 1, 2004, pp. 423-426.
Ran, et al., "On Designing Via-Configurable Cell Blocks for Regular Fabrics" Proceedings of the Design Automation Conference (DAC) 2004, Jun. 7, 2004, ACM Press, s 198-203.
Ran, et al., "The Magic of a Via-Configurable Regular Fabric", Proceedings of the IEEE International Conference on Computer Design (ICCD) Oct. 11, 2004.

(56) References Cited

OTHER PUBLICATIONS

Ran, et al., "Via-Configurable Routing Architectures and Fast Design Mappability Estimation for Regular Fabrics", 2005, IEEE, pp. 25-32, Sep. 1, 2006.
Reis, et al., "Physical Design Methodologies for Performance Predictability and Manufacturability", Apr. 14, 2004, ACM Press, pp. 390-397.
Robertson, et al., "The Modeling of Double Patterning Lithographic Processes", 2007, SPIE Proceeding Series, vol. 6520; Feb. 25, 2007.
Rosenbluth, et al., "Optimum Mask and Source Patterns to Print a Given Shape," 2001 Proc. of SPIE vol. 4346, pp. 486-502, Feb. 25, 2001.
Rovner, "Design for Manufacturability in Via Programmable Gate Arrays", May 1, 2003, Graduate School of Carnegie Mellon University.
Sengupta, "An Integrated CAD Framework Linking VLSI Layout Editors and Process Simulators", 1998, Thesis for Rice University, pp. 1-101, Nov. 1, 1998.
Sengupta, et al., "An Integrated CAD Framework Linking VLSI Layout Editors and Process Simulators", 1996, SPIE Proceeding Series, vol. 2726; pp. 244-252, Mar. 10, 1996.
Sherlekar, "Design Considerations for Regular Fabrics", Apr. 18, 2004, ACM Press, pp. 97-102.
Shi et al., "Understanding the Forbidden Pitch and Assist Feature Placement," Proc. of SPIE vol. 4562, pp. 968-979, Mar. 11, 2002.
Smayling et al., "APF Pitch Halving for 22 nm Logic Cells Using Gridded Design Rules," Proceedings of SPIE, USA, vol. 6925, Jan. 1, 2008, pp. 69251E-1-69251E-7.
Socha, et al., "Simultaneous Source Mask Optimization (SMO)," 2005 Proc. of SPIE vol. 5853, pp. 180-193, Apr. 13, 2005.
Sreedhar et al. "Statistical Yield Modeling for Sub-Wavelength Lithography", 2008 IEEE, Oct. 28, 2008.
Stapper, "Modeling of Defects in Integrated Circuit Photolithographic Patterns", Jul. 1, 1984, IBM, vol. 28 # 4, pp. 461-475.
Taylor, et al., "Enabling Energy Efficiency in Via-Patterned Gate Array Devices", Jun. 7, 2004, ACM Press, pp. 874-877.
Tian et al. "Model-Based Dummy Feature Placement for Oxide Chemical_Mechanical Polishing Manufacturability" IEEE, vol. 20, Issue 7, Jul. 1, 2001.
Tong, et al., "Regular Logic Fabrics for a Via Patterned Gate Array (VPGA), Custom Integrated Circuits Conference", Sep. 21, 2003, Proceedings of the IEEE, pp. 53-56.
Vanleenhove, et al., "A Litho-Only Approach to Double Patterning", 2007, SPIE Proceeding Series, vol. 6520; Feb. 25, 2007.
Wang, et al., "Performance Optimization for Gridded-Layout Standard Cells", vol. 5567 SPIE, Sep. 13, 2004.
Wang, J. et al., Standard Cell Layout with Regular Contact Placement, IEEE Trans. on Semicon. Mfg., vol. 17, No. 3, Aug. 9, 2004.
Webb, Clair, "45nm Design for Manufacturing," Intel Technology Journal, vol. 12, Issue 02, Jun. 17, 2008, ISSN 1535-864X, pp. 121-130.
Webb, Clair, "Layout Rule Trends and Affect upon CPU Design", vol. 6156 SPIE, Feb. 19, 2006.
Wenren, et al., "The Improvement of Photolithographic Fidelity of Two-dimensional Structures Though Double Exposure Method", 2007, SPIE Proceeding Series, vol. 6520; Feb. 25, 2007.
Wilcox, et al., "Design for Manufacturability: A Key to Semiconductor Manufacturing Excellence", 1998 IEEE, pp. 308-313, Sep. 23, 1998.
Wong, et al., "Resolution Enhancement Techniques and Design for Manufacturability: Containing and Accounting for Variabilities in Integrated Circuit Creation," J. Micro/Nanolith. MEMS MOEMS, Sep. 27, 2007, vol. 6(3), 2 pages.
Wu, et al., "A Study of Process Window Capabilities for Two-dimensional Structures under Double Exposure Condition", 2007, SPIE Proceeding Series, vol. 6520; Feb. 25, 2007.
Xiong, et al., "The Constrained Via Minimization Problem for PCB and VLSI Design", 1988 ACM PRESS/IEEE pp. 573-578, Jun. 12, 1998.
Yamamoto, et al., "New Double Exposure Technique without Alternating Phase Shift Mask", SPIE Proceeding Series, vol. 6520; Feb. 25, 2007.
Yamazoe, et al., "Resolution Enhancement by Aerial Image Approximation with 2D-TCC," 2007 Proc. of SPIE vol. 6730, 12 pages, Sep. 17, 2007.
Yang, et al., "Interconnection Driven VLSI Module Placement Based on Quadratic Programming and Considering Congestion Using LFF Principles", 2004 IEEE, pp. 1243-1247, Jun. 27, 2004.
Yao, et al., "Multilevel Routing With Redundant Via Insertion", Oct. 23, 2006, IEEE, pp. 1148-1152.
Yu, et al., "True Process Variation Aware Optical Proximity Correction with Variational Lithography Modeling and Model Calibration," J. Micro/Nanolith. MEMS MOEMS, Sep. 11, 2007, vol. 6(3), 16 pages.
Zheng, et al. "Modeling and Analysis of Regular Symmetrically Structured Power/Ground Distribution Networks", DAC, Jun. 10, 2002, ACM Press, pp. 395-398.
Zhu, et al., "A Stochastic Integral Equation Method for Modeling the Rough Surface Effect on Interconnect Capacitance", 2004 IEEE, Nov. 7, 2004.
Zhu, et al., "A Study of Double Exposure Process Design with Balanced Performance Parameters for Line/Space Applications", 2007, SPIE Proceeding Series, vol. 6520; Feb. 25, 2007.
Zuchowski, et al., "A Hybrid ASIC and FPGA Architecture", 2003 IEEE, pp. 187-194, Nov. 10, 2002.
Alam, Syed M. et al., "A Comprehensive Layout Methodology and Layout-Specific Circuit Analyses for Three-Dimensional Integrated Circuits," Mar. 21, 2002.
Alam, Syed M. et al., "Layout-Specific Circuit Evaluation in 3-D Integrated Circuits," May 1, 2003.
Aubusson, Russel, "Wafer-Scale Integration of Semiconductor Memory," Apr. 1, 1979.
Bachtold, "Logic Circuits with Carbon," Nov. 9, 2001.
Baker, R. Jacob, "CMOS: Circuit Design, Layout, and Simulation (2nd Edition)," Nov. 1, 2004.
Baldi et al., "A Scalable Single Poly EEPROM Cell for Embedded Memory Applications," pp. 1-4, Fig. 1, Sep. 1, 1997.
Cao, Ke, "Design for Manufacturing (DFM) in Submicron VLSI Design," Aug. 1, 2007.
Capodieci, Luigi, "From Optical Proximity Correction to Lithography-Driven Physical Design (1996-2006): 10 years of Resolution Enhancement Technology and the roadmap enablers for the next decade," Proc. SPIE 6154, Optical Microlithography XIX, 615401, Mar. 20, 2006.
Chang, Leland et al., "Stable SRAM Cell Design for the 32 nm Node and Beyond," Jun. 16, 2005.
Cheung, Peter, "Layout Design," Apr. 4, 2004.
Chinnery, David, "Closing the Gap Between ASIC & Custom: Tools and Techniques for High-Performance ASIC Design," Jun. 30, 2002.
Chou, Dyiann et al., "Line End Optimization through Optical Proximity Correction (OPC): A Case Study," Feb. 19, 2006.
Clein, Dan, "CMOS IC Layout: Concepts, Methodologies, and Tools," Dec. 22, 1999.
Cowell, "Exploiting Non-Uniform Access Time," Jul. 1, 2003.
Das, Shamik, "Design Automation and Analysis of Three-Dimensional Integrated Circuits," May 1, 2004.
Dehaene, W. et al., "Technology-Aware Design of SRAM Memory Circuits," Mar. 1, 2007.
Deng, Liang et al., "Coupling-aware Dummy Metal Insertion for Lithography," p. 1, col. 2, Jan. 23, 2007.
Devoivre et al., "Validated 90nm CMOS Technology Platform with Low-k Copper Interconnects for Advanced System-on-Chip (SoC)," Jul. 12, 2002.
Enbody, R. J., "Near-Optimal n-Layer Channel Routing," Jun. 29, 1986.
Ferretti, Marcos et al., "High Performance Asynchronous ASIC Back-End Design Flow Using Single-Track Full-Buffer Standard Cells," Apr. 23, 2004.
Garg, Manish et al., "Litho-driven Layouts for Reducing Performance Variability," p. 2, Figs. 2b-2c, May 23, 2005.

(56) References Cited

OTHER PUBLICATIONS

Greenway, Robert et al., "32nm 1-D Regular Pitch SRAM Bitcell Design for Interference-Assisted Lithography," Oct. 6, 2008.
Gupta et al., "Modeling Edge Placement Error Distribution in Standard Cell Library," Feb. 23, 2006.
Grad, Johannes et al., "A standard cell library for student projects," Proceedings of the 2003 IEEE International Conference on Microelectronic Systems Education, Jun. 2, 2003.
Hartono, Roy et al., "Active Device Generation for Automatic Analog Layout Retargeting Tool," May 13, 2004.
Hartono, Roy et al., "IPRAIL—Intellectual Property Reuse-based Analog IC Layout Automation," Mar. 17, 2003.
Hastings, Alan, "The Art of Analog Layout (2nd Edition)," Jul. 4, 2005.
Hurat et al., "A Genuine Design Manufacturability Check for Designers," Feb. 19, 2006.
Institute of Microelectronic Systems, "Digital Subsystem Design," Oct. 13, 2006.
Ishida, M. et al., "A Novel 6T-SRAM Cell Technology Designed with Rectangular Patterns Scalable beyond 0.18 pm Generation and Desirable for Ultra High Speed Operation," IEDM 1998, Dec. 6, 1998.
Jakusovszky, "Linear IC Parasitic Element Simulation Methodology," Oct. 1, 1993.
Jangkrajarng, Nuttorn et al., "Template-Based Parasitic-Aware Optimization and Retargeting of Analog and RF Integrated Circuit Layouts," Nov. 5, 2006.
Kahng, Andrew B., "Design Optimizations DAC-2006 DFM Tutorial, part V)," Jul. 24, 2006.
Kang, Sung-Mo et al., "CMOS Digital Integrated Circuits Analysis & Design," Oct. 29, 2002.
Kottoor, Mathew Francis, "Development of a Standard Cell Library based on Deep Sub-Micron SCMOS Design Rules using Open Source Software (MS Thesis)," Aug. 1, 2005.
Kubicki, "Intel 65nm and Beyond (or Below): IDF Day 2 Coverage (available at http://www.anandtech.com/show/1468/4)," Sep. 9, 2004.
Kuhn, Kelin J., "Reducing Variation in Advanced Logic Technologies: Approaches to Process and Design for Manufacturability of Nanoscale CMOS," p. 27, Dec. 12, 2007.
Kurokawa, Atsushi et al., "Dummy Filling Methods for Reducing Interconnect Capacitance and Number of Fills. Proc. of ISQED," pp. 586-591, Mar. 21, 2005.
Lavin, Mark, "Open Access Requirements from RDR Design Flows," Nov. 11, 2004.
Liebmann, Lars et al., "Layout Methodology Impact of Resolution Enhancement Techniques," pp. 5-6, Apr. 6, 2003.
Liebmann, Lars et al., "TCAD development for lithography resolution enhancement," Sep. 1, 2001.
Lin, Chung-Wei et al., "Recent Research and Emerging Challenges in Physical Design for Manufacturability/Reliability," Jan. 26, 2007.
McCullen, Kevin W., "Layout Techniques for Phase Correct and Gridded Wiring," pp. 13, 17, Fig. 5, Dec. 1, 2006.
MOSIS, "Design Rules MOSIS Scalable CMOS (SCMOS) (Revision 8.00)," Oct. 4, 2004.
MOSIS, "MOSIS Scalable CMOS (SCMOS) Design Rules (Revision 7.2)," Jan. 1, 1995.
Muta et al., "Manufacturability-Aware Design of Standard Cells," pp. 2686-2690, Figs. 3, 12, Dec. 1, 2007.
Na, Kee-Yeol et al., "A Novel Single Polysilicon EEPROM Cell With a Polyfinger Capacitor," Nov. 30, 2007.
Pan et al., "Redundant Via Enhanced Maze Routing for Yield Improvement," DAC 2005, Jan. 18, 2005.
Park, Tae Hong, "Characterization and Modeling of Pattern Dependencies in Copper Interconnects for Integrated Circuits," Ph.D. Thesis, MIT, May 24, 2002.
Patel, Chetan, "An Architectural Exploration of Via Patterned Gate Arrays (CMU Master's Project)," May 1, 2003.

Pease, R. Fabian et al., "Lithography and Other Patterning Techniques for Future Electronics," IEEE 2008, vol. 96, Issue 2, Jan. 16, 2008.
Serrano, Diego Emilio, Pontificia Universidad Javeriana Facultad De Ingenieria, Departamento De Electronica, "Diseño De Multiplicador 4 X 8 en VLSI, Introduccion al VLSI," 2006 (best available publication date).
Pramanik, "Impact of layout on variability of devices for sub 90nm technologies," 2004 (best available publication date).
Pramanik, Dipankar et al., "Lithography-driven layout of logic cells for 65-nm node (SPIE Proceedings vol. 5042)," Jul. 10, 2003.
Roy et al., "Extending Aggressive Low-K1 Design Rule Requirements For 90 And 65 Nm Nodes Via Simultaneous Optimization Of Numerical Aperture, Illumination And Optical Proximity Correction," J.Micro/Nanolith, MEMS MOEMS, 4(2), 023003, Apr. 26, 2005.
Saint, Christopher et al., "IC Layout Basics: A Practical Guide," Chapter 3, Nov. 5, 2001.
Saint, Christopher et al., "IC Mask Design: Essential Layout Techniques," May 24, 2002.
Scheffer, "Physical CAD Changes to Incorporate Design for Lithography and Manufacturability," Feb. 4, 2004.
Smayling, Michael C., "Part 3: Test Structures, Test Chips, In-Line Metrology & Inspection," Jul. 24, 2006.
Spence, Chris, "Full-Chip Lithography Simulation and Design Analysis: How OPC is changing IC Design, Emerging Lithographic Technologies IX," May 6, 2005.
Subramaniam, Anupama R., "Design Rule Optimization of Regular layout for Leakage Reduction in Nanoscale Design," pp. 474-478, Mar. 24, 2008.
Tang, C. W. et al., "A compact large signal model of LDMOS," Solid-State Electronics 46(2002) 2111-2115, May 17, 2002.
Taylor, Brian et al., "Exact Combinatorial Optimization Methods for Physical Design of Regular Logic Bricks," Jun. 8, 2007.
Tian, Ruiqi et al., "Dummy Feature Placement for Chemical-Mechanical Uniformity in a Shallow Trench Isolation Process," IEEE Trans. on Computer-Aided Design of Integrated Circuits and Systems, vol. 21, No. 1, pp. 63-71, Jan. 1, 2002.
Tian, Ruiqi et al., "Proximity Dummy Feature Placement and Selective Via Sizing for Process Uniformity in a Trench-First-Via-Last Dual-Inlaid Metal Process," Proc. of IITC, pp. 48-50, Jun. 6, 2001.
Torres, J. A. et al., "RET Compliant Cell Generation for sub-130nm Processes," SPIE vol. 4692, Mar. 6, 2002.
Uyemura, John P., "Introduction to VLSI Circuits and Systems," Chapters 2, 3, 5, and Part 3, Jul. 30, 2001.
Uyemura, John, "Chip Design for Submicron VLSI: CMOS Layout and Simulation," Chapters 2-5, 7-9, Feb. 8, 2005.
Verhaegen et al., "Litho Enhancements for 45nm-nod MuGFETs," Aug. 1, 2005.
Wong, Ban P., "Bridging the Gap between Dreams and Nano-Scale Reality (DAC-2006 DFM Tutorial)," Jul. 28, 2006.
Wang, Dunwei et al., "Complementary Symmetry Silicon Nanowire Logic: Power-Efficient Inverters with Gain," Aug. 17, 2006.
Wang, Jun et al., "Effects of grid-placed contacts on circuit performance," pp. 135-139, Figs. 2, 4-8, Feb. 28, 2003.
Wang, Jun et al., "Standard cell design with regularly placed contacts and gates (SPIE vol. 5379)," Feb. 22, 2004.
Wang, Jun et al., "Standard cell design with resolution-enhancement-technique-driven regularly placed contacts and gates," J. Micro/Nanolith, MEMS MOEMS, 4(1), 013001, Mar. 16, 2005.
Watson, Bruce, "Challenges and Automata Applications in Chip-Design Software," pp. 38-40, Jul. 16, 2007.
Weste, Neil et al., "CMOS VLSI Design: A Circuits and Systems Perspective, 3rd Edition," May 21, 2004.
Wingerden, Johannes van, "Experimental verification of improved printability for litho-driven designs," Mar. 14, 2005.
Wong, Alfred K., "Microlithography: Trends, Challenges, Solutions, and Their Impact on Design," Micro IEEE vol. 23, Issue 2, Apr. 29, 2003.
Xu, Gang, "Redundant-Via Enhanced Maze Routing for Yield Improvement," Proceedings of ASP-DAC 2005, Jan. 18, 2005.

(56) References Cited

OTHER PUBLICATIONS

Yang, Jie, "Manufacturability Aware Design," pp. 93, 102, Fig. 5.2, Jan. 16, 2008.
Yongshun, Wang et al., "Static Induction Devices with Planar Type Buried Gate," Chinese Journal of Semiconductors, vol. 25, No. 2, Feb. 1, 2004.
Zobrist, George (editor), "Progress in Computer Aided VLSI Design: Implementations (Ch. 5)," Ablex Publishing Corporation, Feb. 1, 1990.
Petley, Graham, "VLSI and ASIC Technology Standard Cell Library Design," from website www.vlsitechnology.org, Jan. 11, 2005.
Liebmann, Lars, et al., "Layout Optimization at the Pinnacle of Optical Lithography," Design and Process Integration for Microelectronic Manufacturing II, Proceedings of SPIE vol. 5042, Jul. 8, 2003.
Kawasaki, H., et al., "Challenges and Solutions of FinFET Integration in an SRAM Cell and a Logic Circuit for 22 nm node and beyond," Electron Devices Meeting (IEDM), 2009 IEEE International, IEEE, Piscataway, NJ, USA, Dec. 7, 2009, pp. 1-4.

\* cited by examiner

OVERSIZED CONTACTS AND VIAS IN LAYOUT DEFINED BY LINEARLY CONSTRAINED TOPOLOGY

CLAIM OF PRIORITY

This application is a continuation application under 35 U.S.C. 120 of prior U.S. application Ser. No. 14/987,723, filed on Jan. 4, 2016, which is a continuation application under 35 U.S.C. 120 of prior U.S. application Ser. No. 12/466,335, filed on May 14, 2009, issued on Jan. 5, 2016, as U.S. Pat. No. 9,230,910, which:

claims priority under 35 U.S.C. 119(e) to U.S. Provisional Patent Application No. 61/127,727, filed May 14, 2008, and is a continuation-in-part application under 35 U.S.C. 120 of prior U.S. application Ser. No. 12/013,342, filed Jan. 11, 2008, issued as U.S. Pat. No. 7,917,879, on Mar. 29, 2011, which claims priority under 35 U.S.C. 119(e) to both U.S. Provisional Patent Application No. 60/963, 364, filed Aug. 2, 2007, and to prior U.S. Provisional Patent Application No. 60/972,394, filed Sep. 14, 2007, and is a continuation-in-part application under 35 U.S.C. 120 of prior U.S. application Ser. No. 12/212,562, filed Sep. 17, 2008, issued as U.S. Pat. No. 7,842,975, on Nov. 30, 2010, which is a continuation application under 35 U.S.C. 120 of prior U.S. application Ser. No. 11/683, 402, filed Mar. 7, 2007, issued as U.S. Pat. No. 7,446, 352, on Nov. 4, 2008, which claims priority under 35 U.S.C. 119(e) to U.S. Provisional Patent Application No. 60/781,288, filed Mar. 9, 2006.

The disclosure of each above-identified patent application and patent is incorporated herein by reference in its entirety.

CROSS-REFERENCE TO RELATED APPLICATIONS

This application is also related to co-pending U.S. patent application Ser. No. 12/466,341, filed on May 14, 2009, issued as U.S. Pat. No. 8,247,846, on Aug. 21, 2012. The disclosure of the above-identified patent application is incorporated herein by reference in its entirety.

BACKGROUND

A push for higher performance and smaller die size drives the semiconductor industry to reduce circuit chip area by approximately 50% every two years. The chip area reduction provides an economic benefit for migrating to newer technologies. The 50% chip area reduction is achieved by reducing the feature sizes between 25% and 30%. The reduction in feature size is enabled by improvements in manufacturing equipment and materials. For example, improvement in the lithographic process has enabled smaller feature sizes to be achieved, while improvement in chemical mechanical polishing (CMP) has in-part enabled a higher number of interconnect layers.

In the evolution of lithography, as the minimum feature size approached the wavelength of the light source used to expose the feature shapes, unintended interactions occurred between neighboring features. Today minimum feature sizes are being reduced below 45 nm (nanometers), while the wavelength of the light source used in the photolithography process remains at 193 nm. The difference between the minimum feature size and the wavelength of light used in the photolithography process is defined as the lithographic gap. As the lithographic gap grows, the resolution capability of the lithographic process decreases.

An interference pattern occurs as each shape on the mask interacts with the light. The interference patterns from neighboring shapes can create constructive or destructive interference. In the case of constructive interference, unwanted shapes may be inadvertently created. In the case of destructive interference, desired shapes may be inadvertently removed. In either case, a particular shape is printed in a different manner than intended, possibly causing a device failure. Correction methodologies, such as optical proximity correction (OPC), attempt to predict the impact from neighboring shapes and modify the mask such that the printed shape is fabricated as desired. The quality of the light interaction prediction is declining as process geometries shrink and as the light interactions become more complex.

In view of the foregoing, solutions are sought for improvements in circuit design and layout that can improve management of lithographic gap issues as technology continues to progress toward smaller semiconductor device features sizes.

SUMMARY

In one embodiment, a semiconductor chip layout is disclosed. The semiconductor chip layout includes a rectangular-shaped interlevel connection layout structure defined to electrically connect a first layout structure in a first chip level with a second layout structure in a second chip level. The rectangular-shaped interlevel connection layout structure is defined by an as-drawn cross-section having at least one dimension larger than a corresponding dimension of either the first layout structure, the second layout structure, or both the first and second layout structures.

In one embodiment, a semiconductor chip is disclosed. The semiconductor chip includes a rectangular-shaped interlevel connection structure defined to electrically connect a first structure in a first chip level with a second structure in a second chip level. The rectangular-shaped interlevel connection structure is defined by a horizontal cross-section having at least one dimension larger than a corresponding dimension of either the first structure, the second structure, or both the first and second structures. The horizontal cross-section is defined within a plane substantially parallel to a substrate of the semiconductor chip.

Other aspects and advantages of the invention will become more apparent from the following detailed description, taken in conjunction with the accompanying drawings, illustrating by way of example the present invention.

DETAILED DESCRIPTION

Figure 1:
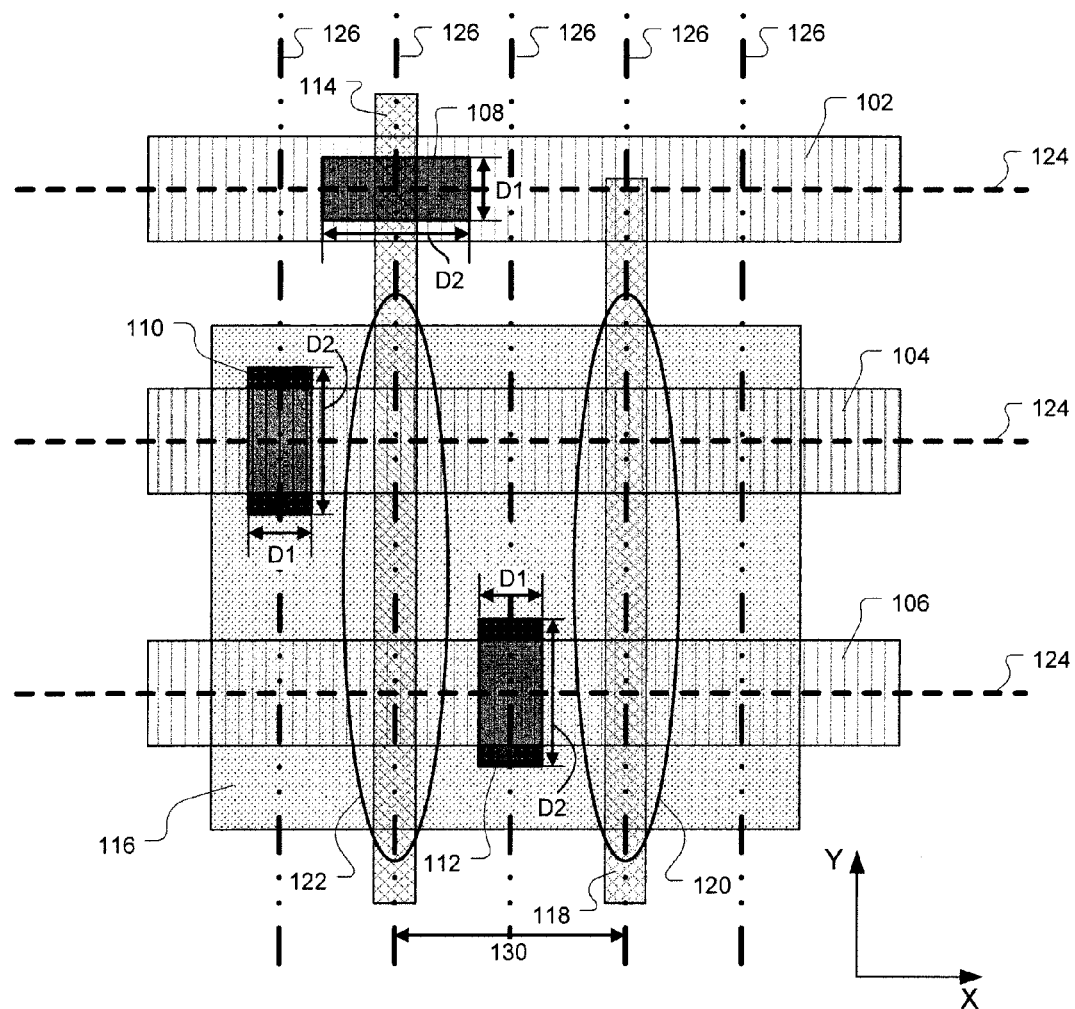
FIG. 1 is an illustration showing a portion of a layout that utilizes oversized diffusion contacts and gate contacts, in accordance with one embodiment of the present invention.

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Linearly Constrained Topology

In deep sub-micron VLSI (Very-Large-Scale Integration) design, process compensation techniques (PCTs) such as Optical Proximity Correction (OPC) or sub-resolution feature utilization, among others, enhance the printing of layout features. PCTs are easier to develop and implement when the layout is highly regular and when the quantity and diversity of lithographic interactions are minimized across the layout.

The linearly constrained topology represents a semiconductor device design paradigm capable of enhancing PCT development and implementation. In the linearly constrained topology, layout features are defined along a regular-spaced virtual grate (or regular-spaced virtual grid) in a number of levels of a cell, i.e., in a number of levels of a semiconductor chip. The virtual grate is defined by a set of equally spaced, parallel virtual lines extending across a portion of a given level in a given chip area. The virtual grid is defined by a first set of equally spaced, parallel virtual lines extending across a given level in a given chip area in a first direction, and by a second set of equally spaced, parallel virtual lines extending across the given level in the given chip area in a second direction, where the second direction is perpendicular to the first direction. A spacing between adjacent virtual lines of the first set of virtual lines may or may not be equal to a spacing between adjacent virtual lines of the second set of virtual lines. In various embodiments, the virtual grate of a given level can be oriented either substantially perpendicular of substantially parallel to the virtual grate of an adjacent level.

A layout feature is defined as a layout shape that extends along a virtual line of a virtual grate without contacting a neighboring layout feature that extends along a different virtual line of the virtual grate. In one embodiment, a layout feature can be defined to have a substantially rectangular cross-section when viewed in an as-drawn state. In another embodiment, a layout feature can be defined to have a primarily rectangular cross-section defined by a width and length, with some allowable variation in width along its length. It should be understood, however, that in this embodiment, the layout feature of varying width may not contact a neighboring layout feature that extends along a different virtual line of the same virtual grate within the same chip level. For example, some layout features may have one or more variations in width at any number of locations along their length, wherein "width" is defined across the substrate in a direction perpendicular to the virtual line along which the layout feature is disposed. Such a variation in width may be used to define a contact head upon which a contact is to connect, or may serve some other purpose. Additionally, different layout features within a given chip level can be defined to have the same width or different widths, so long as the width variation is predictable from a manufacturing perspective and does not adversely impact the manufacture of the layout feature or its neighboring layout features.

In the linearly constrained topology, variations in a vertical cross-section shape of an as-fabricated layout feature can be tolerated to an extent, so long as the variation in the vertical cross-section shape is predictable from a manufacturing perspective and does not adversely impact the manufacture of the given layout feature or its neighboring layout features. In this regard, the vertical cross-section shape corresponds to a cut of the as-fabricated layout feature in a plane perpendicular to the centerline of the layout feature.

Figure 6:
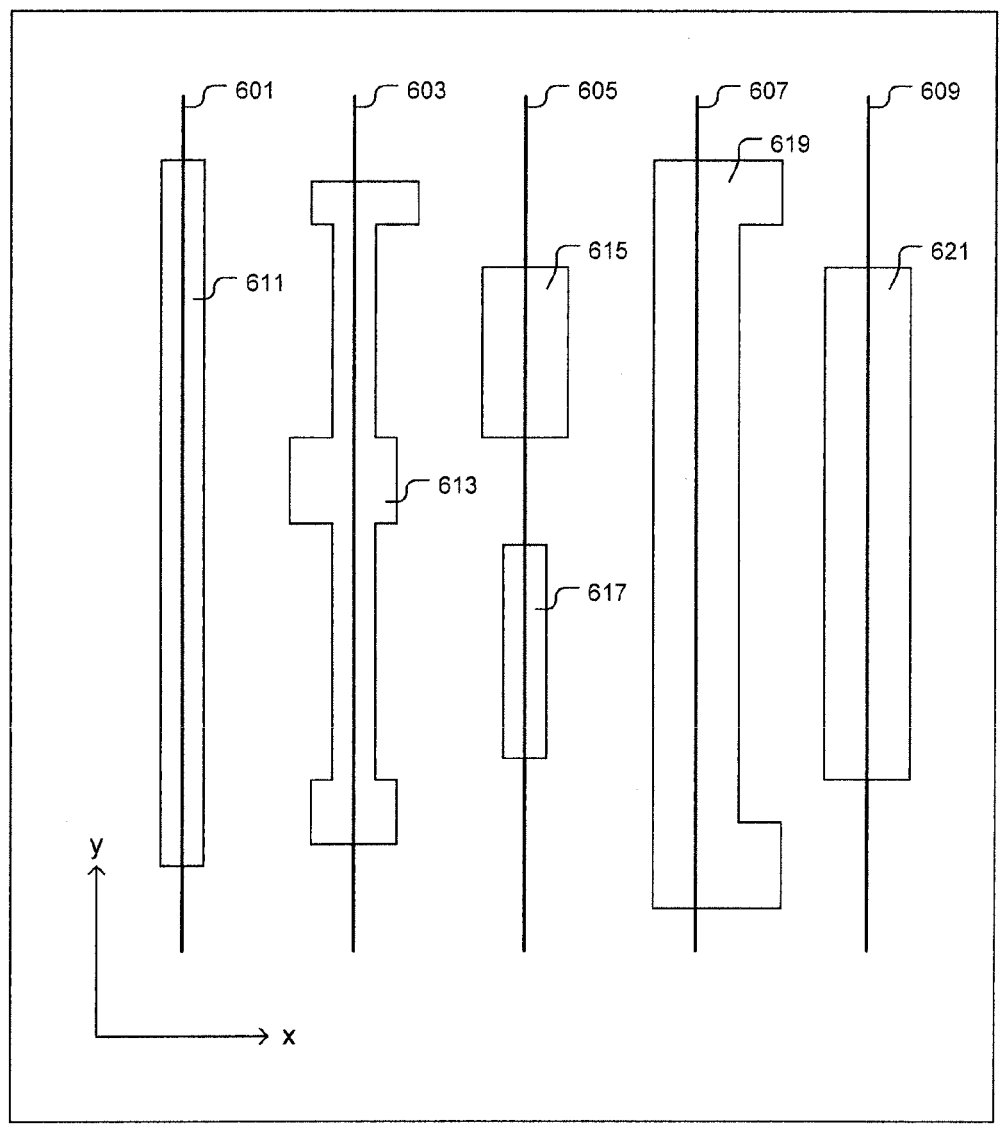
FIG. 6 shows an exemplary chip level layout based on the linearly constrained topology, in accordance with one embodiment of the present invention.

FIG. 6 shows an exemplary chip level layout based on the linearly constrained topology, in accordance with one embodiment of the present invention. A number of virtual lines 601, 603, 605, 607, 609 are each defined to extend across the substrate, i.e., across the chip level layout of the portion of the chip, in a single common direction (y direction). Each of layout features 611, 613, 615, 617, 619, 621 is defined to extend along a single virtual line (601, 603, 605, 605, 607, 609, respectively), without contacting a neighboring layout feature that extends along a different virtual grate line. Some layout features, such as 611, 615, 617, 621, are defined to have a substantially rectangular cross-section when viewed in their as-drawn state. Whereas other layout features, such as 613 and 619, are defined to have some variation in width (in x direction) along their length (in y direction). It should be appreciated that although layout features 613 and 619 vary in width along their length, neither of layout features 613 and 619 contacts a neighboring layout feature that extends along a different virtual grate line.

In one embodiment, each layout feature of a given chip level is substantially centered upon one of the virtual lines of the virtual grate associated with the given chip level. A layout feature is considered to be substantially centered upon a particular virtual grate line when a deviation in alignment between of the centerline of the layout feature and the particular virtual grate line is sufficiently small so as to not reduce a manufacturing process window from what would be achievable with a true alignment between of the centerline of the layout feature and the virtual grate line. In one embodiment, the above-mentioned manufacturing process window is defined by a lithographic domain of focus and exposure that yields an acceptable fidelity of the layout feature. In one embodiment, the fidelity of a layout feature is defined by a characteristic dimension of the layout feature.

In another embodiment, some layout features in a given chip level may not be centered upon a virtual grate line. However, in this embodiment, the layout features remain parallel to the virtual lines of the virtual grate, and hence parallel to the other layout features in the given chip level. Therefore, it should be understood that the various layout features defined in a layout of a given chip level are oriented to extend across the given chip level in a parallel manner.

In one embodiment, within a given chip level defined according to the linearly constrained topology, proximate ends of adjacent, co-aligned layout features may be separated from each other by a substantially uniform gap. More specifically, adjacent ends of layout features defined along a common virtual grate line are separated by an end gap, and such end gaps within the chip level associated with the virtual grate may be defined to span a substantially uniform distance. Additionally, in one embodiment, a size of the end gaps is minimized within a manufacturing process capability so as to optimize filling of a given chip level with layout features. In yet another embodiment, the end gaps, i.e., line end spacings, span multiple (different) distances.

Also, in the linearly constrained topology, a portion of a chip level can be defined to have any number of virtual grate lines occupied by any number of layout features. In one example, a portion of a given chip level can be defined such that all lines of its virtual grate are occupied by at least one layout feature. In another example, a portion of a given chip level can be defined such that some lines of its virtual grate are occupied by at least one layout feature, and other lines of its virtual grate are vacant, i.e., not occupied by any layout features. Furthermore, in a portion of a given chip level, any number of successively adjacent virtual grate lines can be left vacant. Also, the occupancy versus vacancy of virtual grate lines by layout features in a portion of a given chip level may be defined according to a pattern or repeating pattern across the given chip level.

In a given chip level, some of the layout features may form functional structures within an integrated circuit, and other layout features may be non-functional with respect to integrated circuit operation. It should be understood that each of the layout features, regardless of function, is defined such that no layout feature along a given virtual grate line is configured to connect directly within the same chip level to another layout feature defined along a different virtual grate line.

Additionally, within the linearly constrained topology, vias and contacts are defined to interconnect a number of layout features in various levels so as to form a number of functional electronic devices, e.g., transistors, and electronic circuits. Layout features for the vias and contacts can be aligned to a virtual grid. In one embodiment, a virtual grid is defined as a combination of virtual grates associated with a plurality of levels to which the vias and contacts will connect. Also, in one embodiment, a combination of virtual grates used to define a virtual grid can include one or more virtual grates defined independent from a particular chip level.

In the linearly constrained topology, a number of layout features in various chip levels form functional components of an electronic circuit. Additionally, some of layout features within various chip levels may be non-functional with respect to an electronic circuit, but are manufactured nonetheless so as to reinforce manufacturing of neighboring layout features.

Exemplary Embodiments

FIG. 1 is an illustration showing a portion of a layout that utilizes oversized diffusion contacts and gate contacts, in accordance with one embodiment of the present invention. The layout of FIG. 1 includes a diffusion region 116 defined within a substrate. The diffusion region 116 may be of either N-type or P-type in different embodiments. A linear gate electrode level is defined over the substrate and diffusion region 116 therein. The linear gate electrode level is defined to include a number of linear gate electrode features 114 and 118. Generally speaking, each linear gate electrode feature (e.g., 114 and 118), regardless of function, is defined to extend across the linear gate electrode level in a common direction, such that no direct connection exists within the linear gate electrode level between any two linear gate electrode features. In other words, a direct electrical connection is not made solely within the linear gate electrode level between separate linear gate electrode features.

In the exemplary embodiment of FIG. 1, layout features within the linear gate electrode level are placed according to a linear gate electrode level virtual grate as defined by virtual lines 126. The virtual lines 126 are parallel and are spaced at a gate electrode half-pitch, i.e., at one-half of the center-to-center pitch 130 between adjacent linear gate electrodes. Thus, in this embodiment, linear gate electrode features 114 and 118 are placed on every other virtual line 126. It should be understood, however, that in other embodiments the linear gate electrode level virtual grate and corresponding linear gate electrode placements can be defined in different ways, e.g., at different spacings, so long as the linear gate electrode features extend in a common direction and are not directly connected to each other within the linear gate electrode level.

FIG. 1 also shows an interconnect level defined by interconnect level features 102, 104, and 106. In one embodiment, interconnect level features 102, 104, and 106 are defined within a first interconnect level, i.e., a "metal 1" level. In one embodiment, the interconnect level features 102, 104, and 106 are placed according to a virtual grate defined by a number of equally spaced parallel virtual lines 124. The embodiment of FIG. 1 shows the interconnect level virtual grate defined to be perpendicular to the linear gate electrode virtual grate. However, in other embodiments, the interconnect level virtual grate can be defined to be parallel to the linear gate electrode virtual grate.

In one embodiment, gate contacts, diffusion contacts, VIAs, or a combination thereof can be defined in conjunction with one or more linear interconnect levels. In this regard, a linear interconnect level is defined to include linear-shaped interconnect features that, regardless of function, extend in a common direction across the linear interconnect level and do not directly connect to each other by way of a conductive feature defined within the linear interconnect level. FIG. 1 shows an exemplary embodiment in which the interconnect features 102, 104, and 106 are defined as part of a linear interconnect level. However, it should be understood that gate contacts, diffusion contacts, VIAs, or a combination thereof can be defined in accordance with the principles disclosed herein and in conjunction with one or more linear interconnect levels and/or with one or more non-linear interconnect levels. A non-linear interconnect level in this regard includes a number of non-linear interconnect features that extend in more than one direction across the non-linear interconnect level.

Linear gate electrode features 114 and 118 electrically interface with diffusion region 116 to form transistors 122 and 120, respectively. Transistors 122 and 120 share a drain connection made through a diffusion contact 112, extending between the diffusion region 116 and the interconnect level feature 106. Also, transistor 122 has a source connection made through a diffusion contact 110, extending between the diffusion region 116 and the interconnect level feature 104. It should be understood that the layout of FIG. 1 is provided for descriptive purposes and is not intended to represent a particular electronic circuit or electrical functionality.

Each of the diffusion contacts 112 and 110 is of rectangular shape defined by a longer dimension D2 and a shorter dimension D1. In one embodiment, the shorter dimension D1 of each diffusion contact 112 and 110 is the same as a minimum diffusion contact size allowed by conventional design rule. Setting the shorter dimension D1 of the rectangular-shaped diffusion contacts 112 and 110 to the minimum diffusion contact size allowed by conventional design rule enables minimization of the gate electrode-to-gate electrode pitch 130, and thereby enables the layout to be defined over as small a chip area as possible.

It should be understood that the dimension of each rectangular diffusion contact that extends perpendicularly between neighboring gate electrodes can be defined so as to avoid adversely impacting diffusion contact-to-gate electrode spacing. For example, if an originally defined square diffusion contact is "stretched" into a rectangular-shaped diffusion contact, the dimension of the diffusion contact that extends perpendicularly between neighboring gate electrodes can remain unchanged so as to avoid changing the original diffusion contact-to-gate electrode spacing. It should be appreciated that an increase in size of a given diffusion contact in the direction parallel to the gate electrodes, when going from a square-shaped diffusion contact to a rectangular-shaped diffusion contact, should improve diffusion contact yield without requiring an increase in diffusion region area, i.e., without requiring utilization of more chip area.

In one embodiment, a rectangular-shaped diffusion contact is oriented to have its longer dimension extend perpendicularly to the interconnect level feature to which it connects. Also, in one embodiment, a rectangular-shaped diffusion contact is oriented to have its longer dimension extend parallel to its neighboring gate electrodes. Additionally, in one embodiment, a rectangular-shaped diffusion contact is oriented to have its longer dimension extend both parallel to its neighboring gate electrodes and perpendicular to the interconnect level feature to which it connects. For instance, in the exemplary embodiment of FIG. 1, each of the diffusion contacts 110 and 112 is defined to have its longer dimension D2 extend both parallel to its neighboring gate electrodes 114 and 118, and perpendicular to the interconnect level feature to which it connects, 104 and 106 respectively. In one variation of this embodiment, the longer dimension of the rectangular-shaped diffusion contact is defined to overlap at least one side of the interconnect level feature to which it connects. In another variation of this embodiment, the longer dimension of the rectangular-shaped diffusion contact is defined to overlap both sides of the interconnect level feature to which it connects. In yet another variation of this embodiment, the longer dimension of the rectangular-shaped diffusion contact is defined to be about two times a minimum diffusion contact size allowed by conventional design rule.

FIG. 1 also shows a gate contact 108 defined to connect with both the gate electrode feature 114 and the interconnect level feature 102. The gate contact 108 is rectangular shaped, i.e., oversized, so as to ensure connection with the gate electrode feature 114. Also, the gate contact 108 is oriented such that its longer dimension extends in a substantially perpendicular orientation with respect to the centerline of the gate electrode feature 114 to which it connects.

In one embodiment, the gate contact 108 is defined to overlap at least one side of the gate electrode feature 114 to which it connects. In another embodiment, the gate contact 108 is defined to overlap both sides of the gate electrode feature 114 to which it connects.

In one embodiment, such as that shown in FIG. 1, the gate contact 108 is oriented such that its longer dimension extends in a substantially parallel orientation with respect to the centerline of the interconnect level feature 102 to which it connects. In one variant of this embodiment, the gate contact 108 can be placed in a substantially centered manner with respect to the centerline of the interconnect level feature 102 to which it connects. In another variant of this embodiment, the gate contact 108 can be placed in a non-centered manner with respect to the centerline of the interconnect level feature 102 to which it connects, so long as adequate electrical connection is made between the gate contact 108 and the interconnect level feature 102.

In one embodiment, each crossing point between virtual grates associated with different chip levels represents a potential contact or VIA location. Placement of contacts and/or VIAs according to crossing points of two or more virtual grates is defined as placement of contacts and/or VIAs "on-grid." For example, with regard to FIG. 1, each crossing point between the virtual lines 126 of the linear gate electrode level and the virtual lines 124 of the interconnect level represents a potential diffusion contact or gate contact location. In FIG. 1, each of diffusion contacts 110 and 112 and gate contact 108 is considered to be placed on-grid, wherein the grid is defined by the crossing points of the virtual lines 126 and the virtual lines 124. More specifically, in FIG. 1, the rectangular diffusion contacts 110 and 112 and gate contact 108 are centered on a virtual grid points created by the intersection of the interconnect level virtual grate (124) and the linear gate electrode level virtual grate (126), where the linear gate level virtual grate (126) includes parallel virtual lines 126 spaced on the half-pitch of the gate electrode features 114 and 118. Therefore, in the example of FIG. 1, placement of contacts 110, 112, and 108 is constrained in two orthogonal directions by the virtual grates of the linear gate electrode level and the linear interconnect level.

It should be understood, however, that some embodiments do not require placement of contacts and/or VIAs to be constrained in two orthogonal directions by virtual grates. For example, in one embodiment, placement of contacts and/or VIAs can be constrained in a first direction based on one or more virtual grates, and unconstrained in a second direction orthogonal to the first direction. For example, with regard to FIG. 1, the diffusion contacts 110 and 112 and/or the gate contact 108 can be constrained in the horizontal direction, i.e., x-direction, so as to be centered on the virtual lines 126, which are spaced on the half-pitch of the gate electrode features 114 and 118, and can be unconstrained in the vertical direction, i.e., y-direction, so as to enable adjustment for design rule compliance. Thus, in one embodiment, placement of diffusion contacts and/or gate contacts can be constrained only by the virtual grate of the linear gate electrode level. In another embodiment, placement of the diffusion contacts and/or gate contacts can be unconstrained with regard to virtual grates of various chip levels, so long as the diffusion contacts and/or gate contacts are placed to make required connections and are defined within an achievable manufacturing process window.

Figure 2:
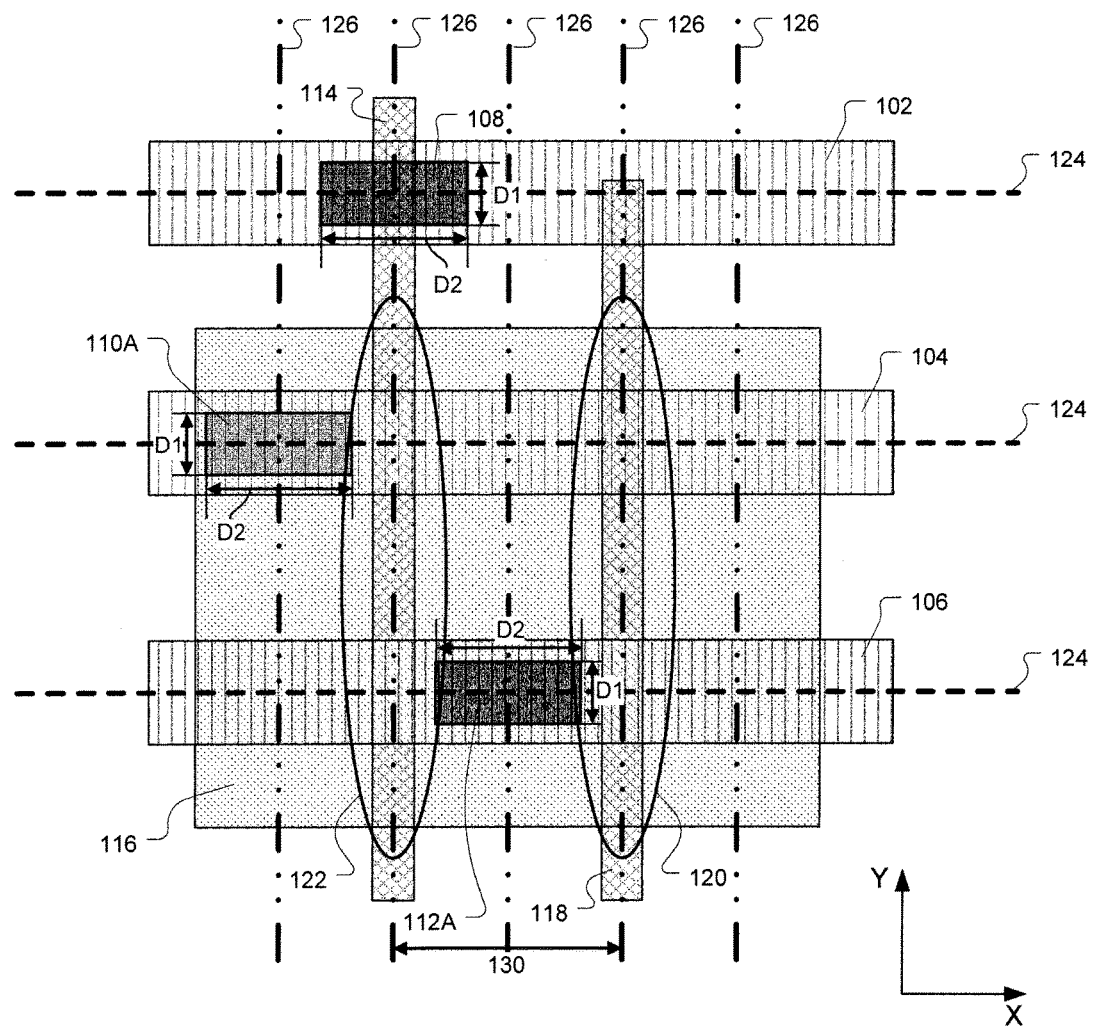
FIG. 2 is an illustration showing the rectangular contact layout of FIG. 1 with rectangular diffusion contacts rotated so that their long dimension extends in the same direction as the long dimension of the rectangular gate contact, and hence extends in a direction substantially perpendicular to the centerline of the gate electrode features, thereby forming rectangular diffusion contacts, in accordance with one embodiment of the present invention.

FIG. 2 is an illustration showing the rectangular contact layout of FIG. 1 with the rectangular diffusion contacts 110 and 112 rotated so that their long dimension (D2) extends in the same direction as the long dimension (D2) of the rectangular gate contact 108, and hence extends in a direction substantially perpendicular to the centerline of the gate electrode features 114 and 118, thereby forming rectangular diffusion contacts 110A and 112A, in accordance with one embodiment of the present invention. It should be appreciated that for a given gate electrode pitch with placement of diffusion contacts on the half-pitch of the gate electrode features, orientation of rectangular diffusion contacts to have their long dimension (D2) extend perpendicular to the centerlines of the gate electrodes (such as with diffusion contact 112A of FIG. 2) results in a smaller diffusion contact-to-gate electrode spacing, relative to the configuration in which the rectangular diffusion contacts are oriented to have their long dimension (D2) extend parallel to the gate electrode features (such as with diffusion contact 112 of FIG. 1). In one embodiment, the rectangular diffusion contacts 110A and 112A can be self-aligned to the diffusion level so that a reduction in diffusion contact-to-gate electrode spacing does not impact, i.e., increase, the required gate electrode pitch and correspondingly increase an amount of chip area required for the layout.

In one embodiment, all rectangular-shaped contacts (both diffusion and gate contacts) in a layout region are oriented to have their longer dimension extend in the same direction across the level of the chip. This embodiment may enable a more efficient OPC solution for the contacts in the layout region. However, in another embodiment, each rectangular-shaped contact (diffusion/gate) in a layout region can be independently oriented to have its longer dimension extend in either of multiple directions across the level of the chip without regard to an orientation of other contacts within the layout region. In this embodiment, placement of contacts according to a virtual grid within the layout region may enable a more efficient OPC solution for the contacts in the layout region.

Figure 3:
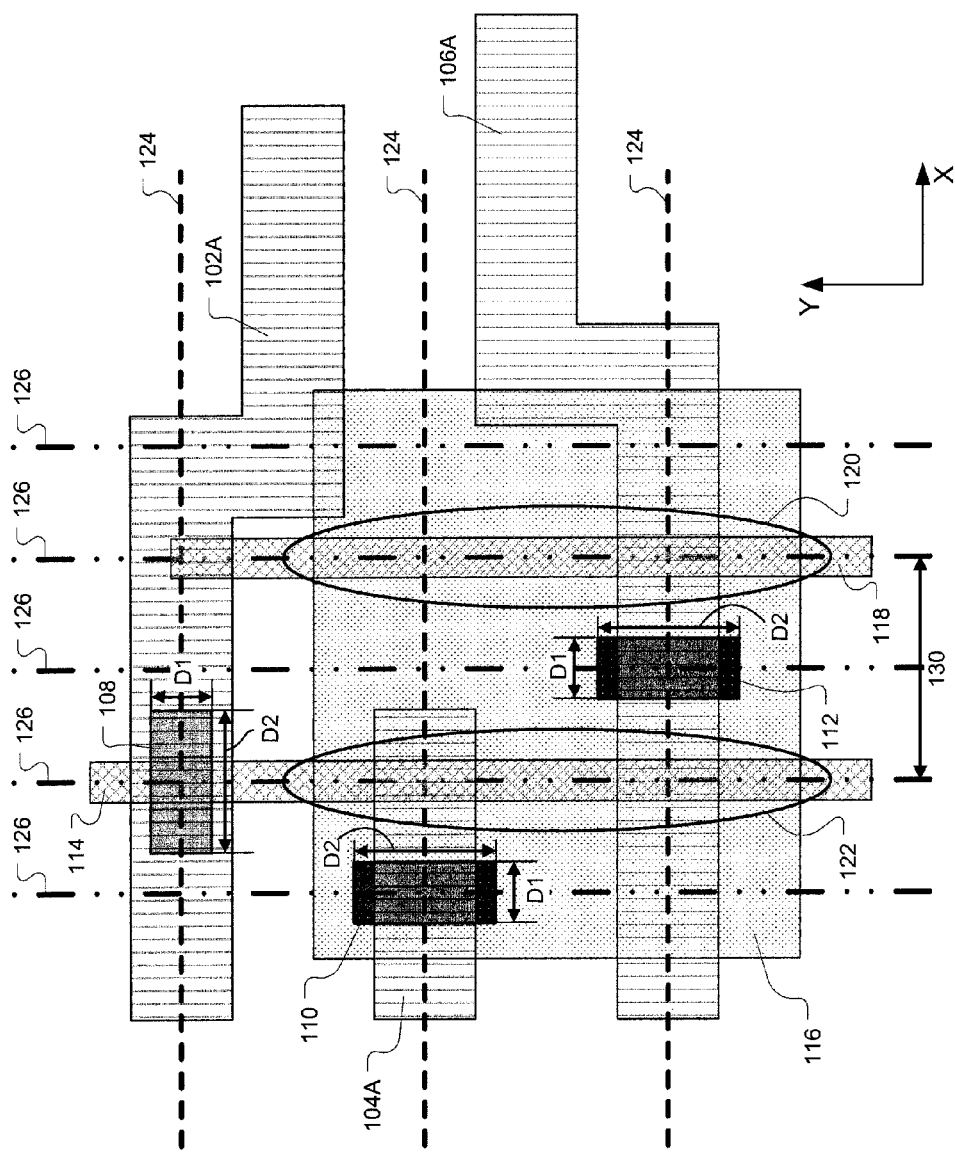
FIG. 3 is an illustration showing the rectangular contact and linear gate level layout of FIG. 1 defined in conjunction with a non-linear interconnect level, in accordance with one embodiment of the present invention.

FIG. 3 is an illustration showing the rectangular contact and linear gate level layout of FIG. 1 defined in conjunction with a non-linear interconnect level, in accordance with one embodiment of the present invention. Although the interconnect level is shown to have a corresponding virtual grate defined by virtual lines 124, the interconnect level features 102A, 104A, and 106A are not required to extend in a single common direction across the layout and are not required to be placed according to the virtual grate of the non-linear interconnect level. In other words, layout features within the non-linear interconnect level may include bends, such as those shown in interconnect level features 102A and 106A. Also, in one embodiment, a portion of the interconnect level features may be placed according to the virtual grate (124) of the non-linear interconnect level. However, in another embodiment, the interconnect level features of the non-linear interconnect level may be placed without regard to a virtual grate.

As previously discussed, in one embodiment, placement of the rectangular diffusion contacts 110 and 112 and gate contact 108 may be constrained by the virtual grate (126) of the linear gate level. However, depending on the embodiment, placement of the rectangular diffusion contacts 110 and 112 and gate contact 108 may or may not be constrained by the virtual grate (124) of the interconnect level. Moreover, in the case of the non-linear interconnect level, placement of the rectangular diffusion contacts 110 and 112 and gate contact 108 may be constrained only in the x-direction by the virtual grate (126) of the linear gate level, while unconstrained in the y-direction so as to enable design rule compliance with regard to placement of the diffusion contacts 110 and 112 and gate contact 108 relative to the interconnect level features 102A, 104A, 106A to which they electrically connect.

Figure 4:
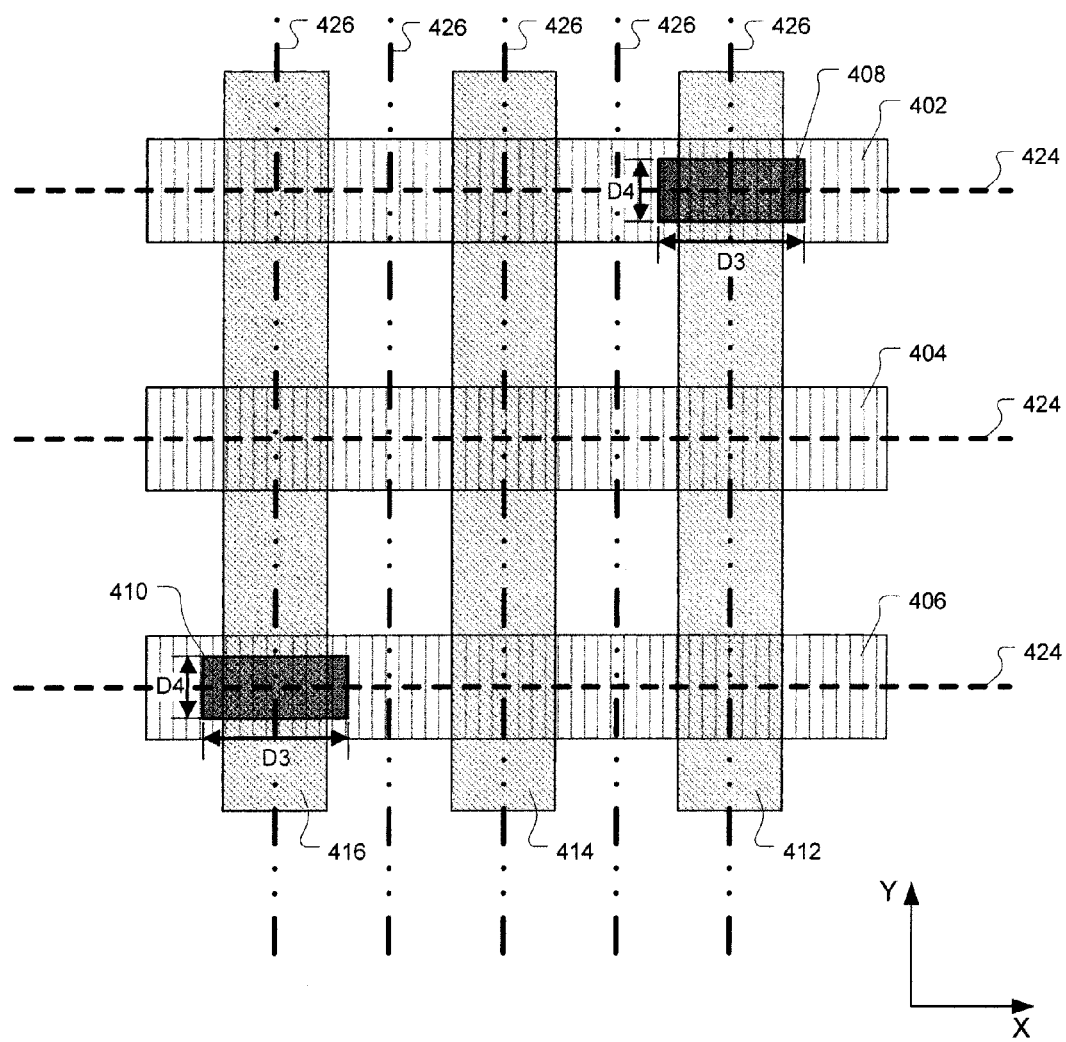
FIG. 4 is an illustration showing placement of rectangular VIAs to make connections between two interconnect levels, in accordance with one embodiment of the present invention.

FIG. 4 is an illustration showing placement of rectangular VIAs to make connections between two interconnect levels, in accordance with one embodiment of the present invention. A first of the two interconnect levels is defined by interconnect level features 402, 404, and 406. A second of the two interconnect levels is defined by interconnect level features 416, 414, and 412. In the example layout of FIG. 4, each of the two interconnect levels is defined as a linear interconnect level. More specifically, each of interconnect level features 402, 404, and 406 is linear-shaped and is placed so as to be substantially centered upon a respective virtual line 424 of the virtual grate associated with the interconnect level. Similarly, each of interconnect level features 416, 414, and 412 is linear-shaped and is placed so as to be substantially centered upon a respective virtual line 426 of the virtual grate associated with the interconnect level. As previously mentioned, a linear interconnect level is defined to include linear-shaped interconnect features that, regardless of function, extend in a common direction across the linear interconnect level and do not directly connect to each other by way of a conductive feature defined within the linear interconnect level.

In one embodiment, the interconnect features 402, 404 and 406 in FIG. 4 are defined on a lower interconnect level and the interconnect features 412, 414 and 416 are defined on an upper interconnect level. In another embodiment, the interconnect features 402, 404 and 406 in FIG. 4 are defined on an upper interconnect level and the interconnect features 412, 414 and 416 are defined on a lower interconnect level. In one embodiment, virtual grates 424 and 426 are oriented perpendicular to each other, thereby causing the interconnect features 402, 404, 406, to extend perpendicular to the interconnect features 412, 414, 416. Also, it should be understood that the lower and upper interconnect level orientations can be rotated with respect to each other such that the lower interconnect level features extend in the y-direction and the upper interconnect level features extend in the x-direction, vice-versa.

In the exemplary embodiment of FIG. 4, a rectangular-shaped VIA 408 is defined to make an electrical connection between interconnect features 412 and 402. Also, a rectangular-shaped VIA 410 is defined to make an electrical connection between interconnect features 416 and 406. Also, in the exemplary embodiment of FIG. 4, each of the rectangular VIAs 408 and 410 is centered on a grid point defined by an intersection of a virtual line of the lower interconnect level virtual grate (424) and a virtual line of the upper interconnect level virtual grate (426). Also, in the exemplary embodiment of FIG. 4, each of the rectangular VIAs 408 and 410 is oriented to have its longer dimension (D3) extend in the direction of the virtual lines of the lower interconnect level virtual grate (424). However, it should be understood that in another embodiment, each of the rectangular VIAs 408 and 410 is oriented to have its longer dimension (D3) extend in the direction of the virtual lines of the upper interconnect level virtual grate (426).

Orientation of the rectangular VIAs can be set to optimize manufacturability and/or chip area utilization. In one embodiment, all rectangular VIAs within a given chip level are oriented to have their respective longer dimension (D3) extend in a common direction to facilitate optimum OPC (Optical Proximity Correction) and/or lithography light source optimization. However, in another embodiment, each rectangular VIA can be independently oriented within a given chip level, such that multiple VIA orientations are utilized within the given chip level. In this embodiment, each VIA orientation may be based on a more localized OPC and/or lithography light source optimization.

More specifically, in one embodiment, each rectangular-shaped VIA in a layout region is oriented to have its longer dimension extend in the same direction across the level of the chip. This embodiment may enable a more efficient OPC solution for the VIAs in the layout region. However, in another embodiment, each rectangular-shaped VIA in a layout region can be independently oriented to have its longer dimension extend in either of multiple directions across the level of the chip without regard to an orientation of other VIAs within the layout region. In this embodiment, placement of VIAs according to a virtual grid within the layout region may enable a more efficient OPC solution for the VIAs in the layout region. Additionally, in various embodiments, rectangular-shaped VIAs within a given layout region may be oriented to have their longer dimension extend perpendicularly with respect to an interconnect feature in either a lower interconnect level or a upper interconnect level.

In one embodiment, the longer dimension (D3) of a given VIA is defined to be larger than a width of a perpendicularly oriented interconnect feature to which the given VIA is electrically connected, wherein the width of the perpendicularly oriented interconnect feature is measured perpendicular to a centerline of the perpendicularly oriented interconnect feature. In one embodiment, the given VIA can be placed to overlap at least one edge of the perpendicularly oriented interconnect feature to which the given VIA is electrically connected. In another embodiment, the given VIA can be placed to overlap both edges of the perpendicularly oriented interconnect feature to which the given VIA is electrically connected. In one embodiment, a shorter dimension (D4) of a given VIA is defined to be set at a minimum VIA size allowed by conventional design rule. Also, in one embodiment, the longer dimension (D3) of a given VIA is defined to be about two times a minimum VIA size allowed by conventional design rule.

Although the exemplary embodiment of FIG. 4 shows the interconnect level features 402, 404, 406, 412, 414, 416 and VIAs 408, 410 placed on the virtual grid defined by virtual grates 424 and 426, it should be understood that placement of interconnect level features and/or VIAs on-grid is not a requirement for all embodiments. Also, in a given embodiment, a portion of interconnect level features and/or a portion of VIAs may be placed according to a virtual grid, with a remaining portion of interconnect level features and/or VIAs placed without regard to a virtual grid. Therefore, in one embodiment, rectangular VIA placement can be constrained in two orthogonal directions (i.e., x- and y-directions) by respective virtual grates. In another embodiment, rectangular VIA placement can be constrained in one direction by a virtual grate and unconstrained in a corresponding orthogonal direction. In yet another embodiment, rectangular VIA placement can be unconstrained in two orthogonal directions (i.e., x- and y-directions).

Figure 5A:
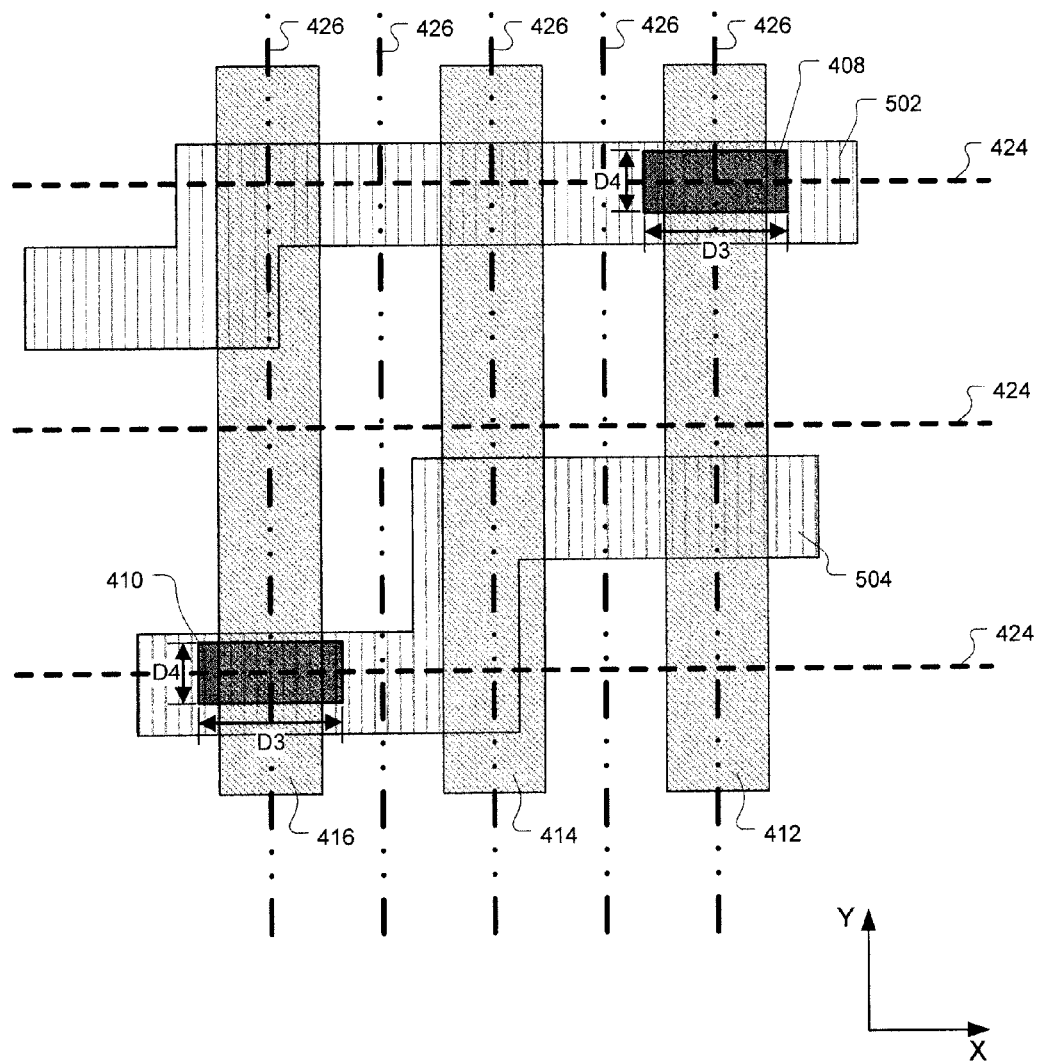
FIG. 5A is an illustration showing a variation of the exemplary layout of FIG. 4, in which one of the interconnect levels is defined as a non-linear interconnect level, and another of the interconnect levels is defined as a linear interconnect level.

FIG. 5A is an illustration showing a variation of the exemplary layout of FIG. 4, in which one of the interconnect levels is defined as a non-linear interconnect level, and another of the interconnect levels is defined as a linear interconnect level, in accordance with one embodiment of the present invention. Specifically, a non-linear interconnect level is defined to include interconnect features 502 and 504. The linear interconnect level is defined by linear interconnect features 412, 414, and 416 placed according to virtual grate 426. In one embodiment, the non-linear interconnect level is defined as a lower level with respect to the linear interconnect level. In another embodiment, the non-linear interconnect level is defined as an upper level with respect to the linear interconnect level.

In one embodiment, the non-linear interconnect level is defined in a completely arbitrary manner without regard to any virtual grate. For example, FIG. 5A shows the interconnect features 502 and 504 defined without regard to either of virtual grates 426 or 424. In one embodiment, placement of each VIA is constrained in one direction by the virtual grate of the linear interconnect level, and is unconstrained in a corresponding orthogonal direction. For example, with regard to FIG. 5A, placement of VIAs 408 and 410 can be constrained in the x-direction by the virtual grate 426 of the linear interconnect level, but may be unconstrained in the y-direction.

Figure 5B:
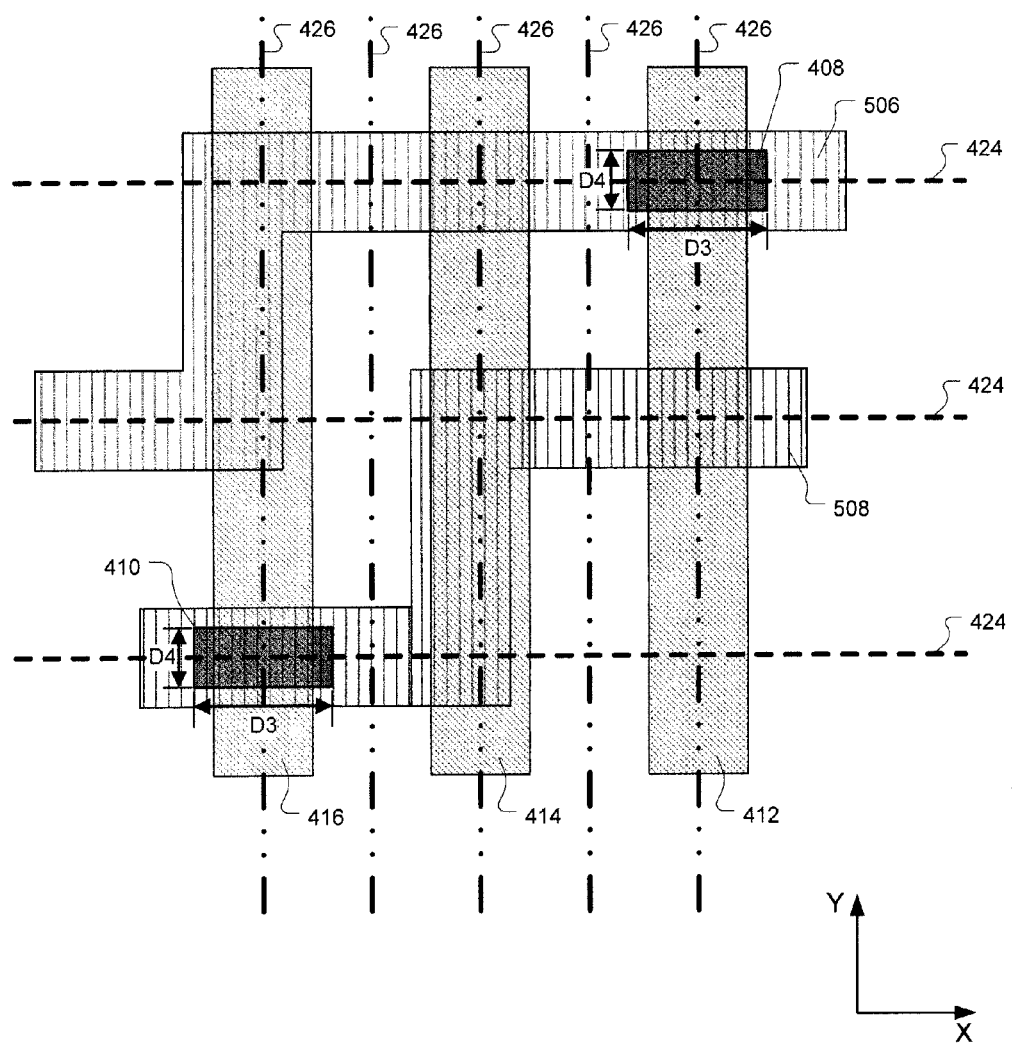
FIG. 5B is an illustration showing a variation of the exemplary layout of FIG. 5A, in which the non-linear interconnect level is constrained in the y-direction by the virtual grate, but is unconstrained in the x-direction.

In another embodiment, the non-linear interconnect level is defined in a partially constrained manner according to a virtual grate. FIG. 5B is an illustration showing a variation of the exemplary layout of FIG. 5A, in which the non-linear interconnect level is constrained in the y-direction by the virtual grate 424, but is unconstrained in the x-direction, in accordance with one embodiment of the present invention. For example, each of non-linear interconnect features 506 and 508 includes segments extending in the x-direction that are constrained in the y-direction by the virtual grate 424, and also includes segments extending in the y-direction that are unconstrained with regard to a virtual grate. In this embodiment, placement of the VIAs 408 and 410 according to the virtual grates 424 and 426 should ensure connection between the linear interconnect level and the non-linear interconnect level, when the VIAs 408 and 410 connect with segments of the non-linear interconnect features 506 and 508 that extend in the x-direction.

Figure 5C:
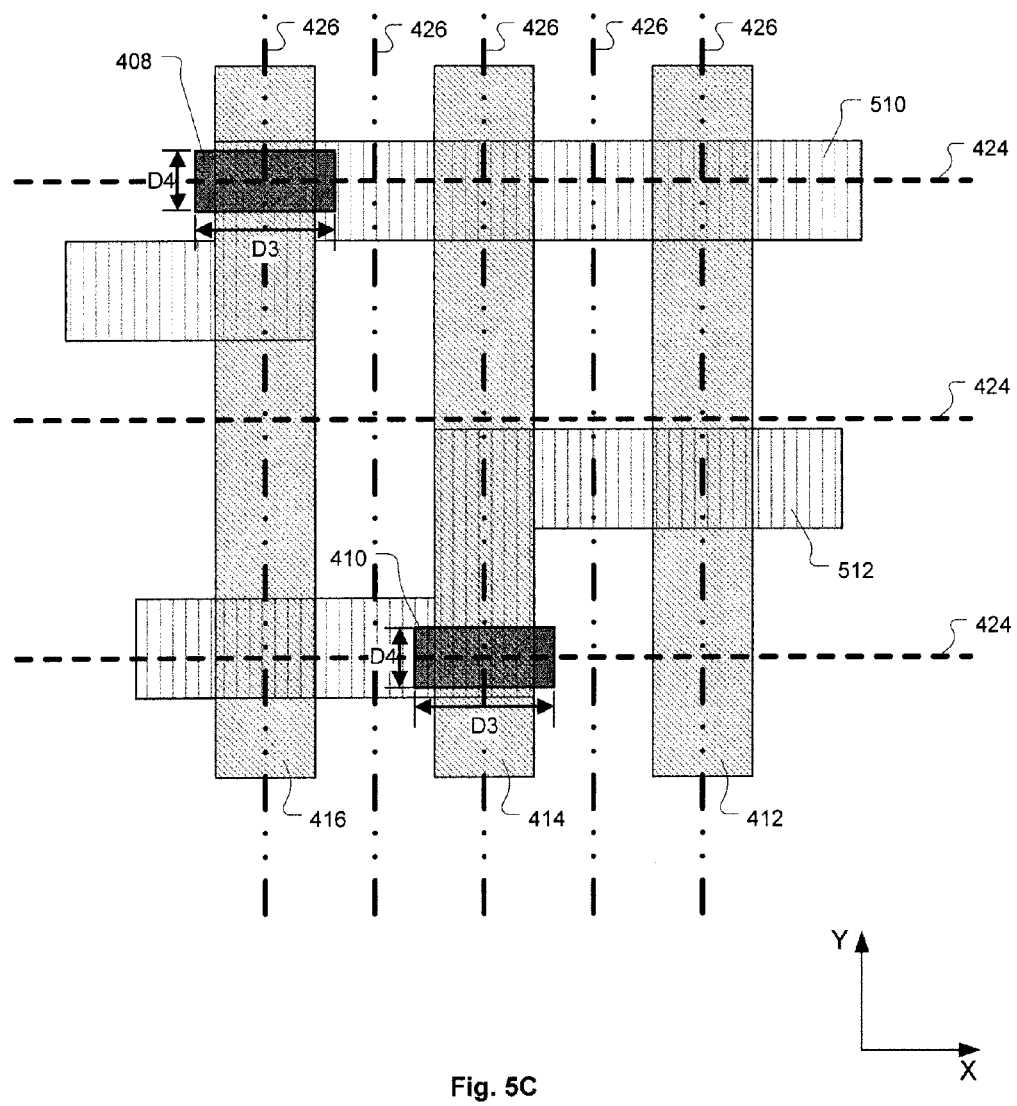
FIG. 5C is an illustration showing a variation of the exemplary layout of FIG. 5A, in which the non-linear interconnect level is constrained in the x-direction by the virtual grate, but is unconstrained in the y-direction.

FIG. 5C is an illustration showing a variation of the exemplary layout of FIG. 5A, in which the non-linear interconnect level is constrained in the x-direction by the virtual grate 426, but is unconstrained in the y-direction, in accordance with one embodiment of the present invention. For example, each of non-linear interconnect features 510 and 512 includes segments extending in the y-direction that are constrained in the x-direction by the virtual grate 426, and also includes segments extending in the x-direction that are unconstrained with regard to a virtual grate. In this embodiment, placement of the VIAs 408 and 410 according to the virtual grates 424 and 426 should ensure connection between the linear interconnect level and the non-linear interconnect level, when the VIAs 408 and 410 connect with segments of the non-linear interconnect features 510 and 512 that extend in the y-direction.

Figure 5D:
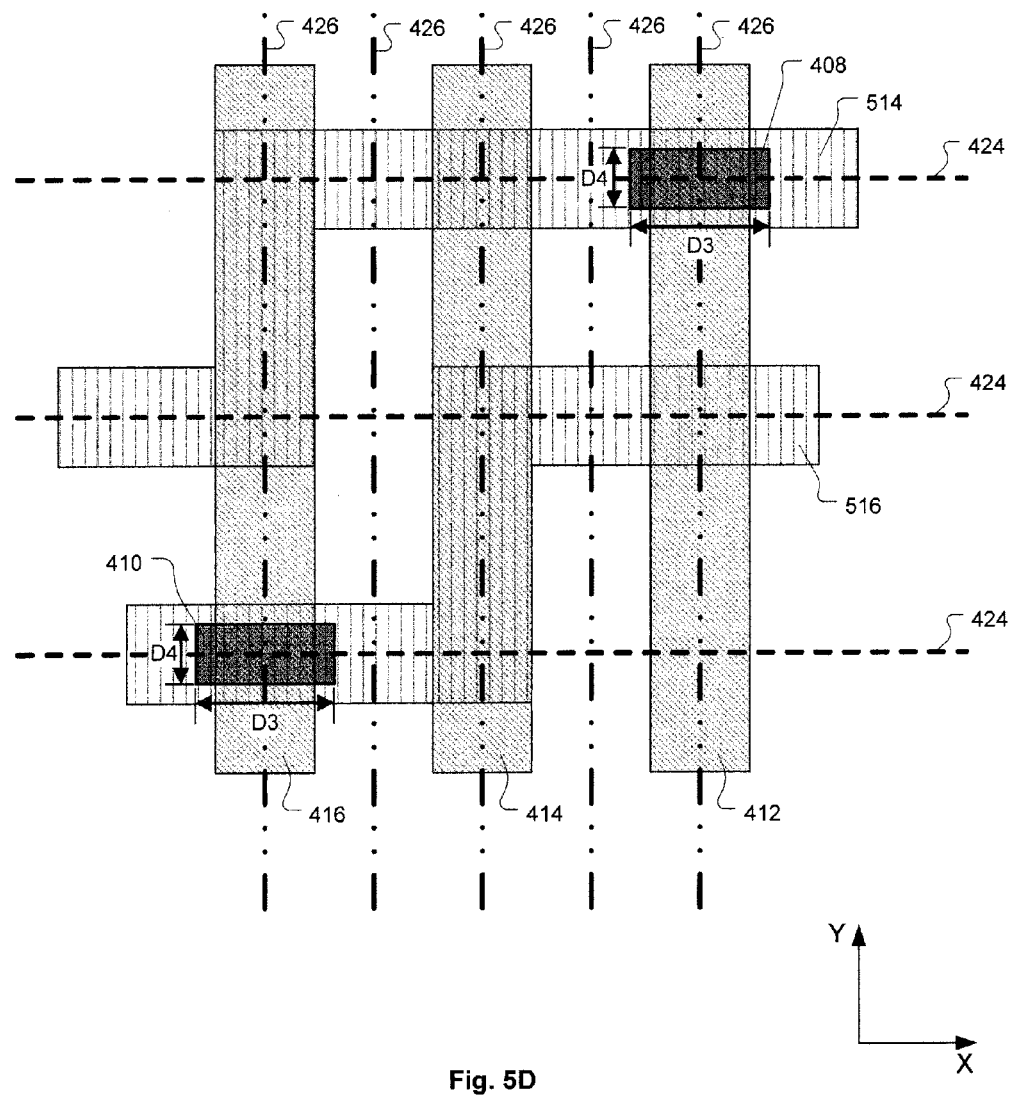
FIG. 5D is an illustration showing a variation of the exemplary layout of FIG. 5A, in which the non-linear interconnect level is constrained in both the x- and y-directions by the virtual grates.

In another embodiment, the non-linear interconnect level is defined in a fully constrained manner according to a pair of orthogonally related virtual grates. FIG. 5D is an illustration showing a variation of the exemplary layout of FIG. 5A, in which the non-linear interconnect level is constrained in both the x- and y-directions by the virtual grates 426 and 424, respectively, in accordance with one embodiment of the present invention. For example, each of non-linear interconnect features 514 and 516 includes segments extending in the x-direction that are constrained in the y-direction by the virtual grate 424, and also includes segments extending in the y-direction that are constrained in the x-direction by the virtual grate 426. In this embodiment, placement of a given VIA according to the pair of orthogonally related virtual grates should ensure connection between the linear interconnect level and the non-linear interconnect level, so long as a non-linear interconnect level feature is defined to extend over the given VIA.

Although the foregoing exemplary embodiments have been described as implementing rectangular-shaped diffusion contacts, gate contacts, and VIAs, it should be understood that other embodiments may utilize oversized square-shaped diffusion contacts, gate contacts, VIAs, or a combination thereof. Placement of the oversized square-shaped contacts and/or VIAs can be constrained by one or more virtual grates, just as described for the rectangular-shaped contacts and/or VIAs. Additionally, it should be understood that the oversized square-shaped contacts and/or VIAs can be oversized with regard to the size of corresponding contacts and/or VIAs as allowed by conventional design rule.

As discussed with regard to FIGS. 1 through 5D, each of the example contacts and vias represents a rectangular-shaped interlevel connection layout structure defined to electrically connect a first layout structure in a first chip level with a second layout structure in a second chip level. The rectangular-shaped interlevel connection layout structure is defined by an as-drawn cross-section having at least one dimension larger than a corresponding dimension of at least one of the first layout structure and the second layout structure. For example, in FIG. 1, the diffusion contact 110 has a dimension D2 larger than the corresponding dimension of interconnect level feature 104. Also in FIG. 1, the gate contact 108 has a dimension D2 larger than the corresponding dimension of gate electrode feature 114. Additionally, by way of example, FIG. 4 shows that the VIA 408 has a dimension D3 larger than the corresponding dimension of interconnect feature 412.

In one embodiment, a smallest dimension of the as-drawn cross-section of the rectangular-shaped interlevel connection layout structure is minimally sized within design rule requirements pertaining to the semiconductor chip layout. Also, in one embodiment, a smallest dimension of the as-drawn cross-section of the rectangular-shaped interlevel connection layout structure is sized substantially equal to a minimum transistor channel length allowed by design rule requirements pertaining to the semiconductor chip layout. Additionally, in one embodiment, a largest dimension of the as-drawn cross-section of the rectangular-shaped interlevel connection layout structure is sized to exceed a normal maximum size allowed by design rule requirements pertaining to the semiconductor chip layout. In one embodiment, the as-drawn cross-section of the rectangular-shaped interlevel connection layout structure is square-shaped such that each side of the as-drawn cross-section is the same size and is larger than at least one dimension of at least one of the first layout structure and the second layout structure to which the rectangular-shaped interlevel connection layout structure connects.

In one embodiment, the rectangular-shaped interlevel connection layout structure, e.g., contact or via, is placed in a substantially centered manner with respect to a gridpoint of a virtual grid. The virtual grid is defined by a first set of virtual lines extending in a first direction and by a second set of virtual lines extending in a second direction perpendicular to the first direction. The gridpoint of the virtual grid is defined by an intersection between respective virtual lines of the first and second sets of virtual lines. For example, FIG. 1 shows the virtual grid defined by the first set of virtual line 126 and by the second set of virtual lines 124. The gate contact 108 is placed in a substantially centered manner with respect to a gridpoint defined by an intersection between respective virtual lines of the first and second sets of virtual lines 126 and 124, respectively.

In one embodiment, one or both of the first and second layout structures to which the rectangular-shaped interlevel connection layout structure is connected is defined to include one or more linear segments respectively centered upon one or more of virtual lines of the virtual grid. Also, one or both of the first and second layout structures to which the rectangular-shaped interlevel connection layout structure is connected can be defined by multiple linear segments substantially centered upon multiple virtual lines of the virtual grid, and by one or more orthogonal segments extending perpendicularly between the multiple linear segments. In one embodiment, each of the multiple linear segments and one or more orthogonal segments of the first and/or second layout structures has a substantially rectangular-shaped cross-section when viewed in an as-drawn state. Additionally, in one embodiment, the one or more orthogonal segments of the first and/or second layout structures is substantially centered upon a given virtual line of the virtual grid.

It should be understood that the oversized contacts and/or vias as disclosed herein can be defined in a layout that is stored in a tangible form, such as in a digital format on a computer readable medium. For example, the layout including the oversized contacts and/or vias as disclosed herein can be stored in a layout data file of one or more cells, selectable from one or more libraries of cells. The layout data file can be formatted as a GDS II (Graphic Data System) database file, an OASIS (Open Artwork System Interchange Standard) database file, or any other type of data file format suitable for storing and communicating semiconductor device layouts. Also, multi-level layouts utilizing the oversized contacts and/or vias can be included within a multi-level layout of a larger semiconductor device. The multi-level layout of the larger semiconductor device can also be stored in the form of a layout data file, such as those identified above.

Also, the invention described herein can be embodied as computer readable code on a computer readable medium. For example, the computer readable code can include the layout data file within which one or more layouts including the oversized contacts and/or vias are stored. The computer readable code can also include program instructions for selecting one or more layout libraries and/or cells that include a layout having oversized contacts and/or vias defined therein. The layout libraries and/or cells can also be stored in a digital format on a computer readable medium.

The computer readable medium mentioned herein is any data storage device that can store data which can thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network of coupled computer systems so that the computer readable code is stored and executed in a distributed fashion.

Any of the operations described herein that form part of the invention are useful machine operations. The invention also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data maybe processed by other computers on the network, e.g., a cloud of computing resources.

The embodiments of the present invention can also be defined as a machine that transforms data from one state to another state. The data may represent an article, that can be represented as an electronic signal and electronically manipulate data. The transformed data can, in some cases, be visually depicted on a display, representing the physical object that results from the transformation of data. The transformed data can be saved to storage generally, or in particular formats that enable the construction or depiction of a physical and tangible object. In some embodiments, the manipulation can be performed by a processor. In such an example, the processor thus transforms the data from one thing to another. Still further, the methods can be processed by one or more machines or processors that can be connected over a network. Each machine can transform data from one state or thing to another, and can also process data, save data to storage, transmit data over a network, display the result, or communicate the result to another machine.

It should be further understood that the oversized contacts and/or vias as disclosed herein can be manufactured as part of a semiconductor device or chip. In the fabrication of semiconductor devices such as integrated circuits, memory cells, and the like, a series of manufacturing operations are performed to define features on a semiconductor wafer. The wafer includes integrated circuit devices in the form of multi-level structures defined on a silicon substrate. At a substrate level, transistor devices with diffusion regions are formed. In subsequent levels, interconnect metallization lines are patterned and electrically connected to the transistor devices to define a desired integrated circuit device. Also, patterned conductive layers are insulated from other conductive layers by dielectric materials.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. A semiconductor device, comprising:
a first linear-shaped gate electrode level structure configured to form a gate electrode of a first transistor, the first linear-shaped gate electrode level structure oriented to extend lengthwise in a first direction;
a second linear-shaped gate electrode level structure configured to form a gate electrode of a second transistor, the second linear-shaped gate electrode level structure oriented to extend lengthwise in the first direction, wherein the first and the second linear-shaped gate electrode level structures are positioned next to each other such that their respective lengthwise-oriented centerlines are separated from each other by a gate electrode pitch as measured in a second direction perpendicular to the first direction;
a first linear-shaped interconnect level structure configured to extend lengthwise in the second direction over both the first linear-shaped gate electrode level structure and the second linear-shaped gate electrode level structure;
a second linear-shaped interconnect level structure configured to extend lengthwise in the second direction over both the first linear-shaped gate electrode level structure and the second linear-shaped gate electrode level structure;
a third linear-shaped interconnect level structure configured to extend lengthwise in the second direction over both the first linear-shaped gate electrode level structure and the second linear-shaped gate electrode level structure;
a first interlevel connection structure having a rectangular-shaped horizontal cross-section defined by a first size as measured in the first direction and a second size as measured in the second direction, the second size of the horizontal cross-section of the first interlevel connection structure being at least twice the first size of the horizontal cross-section of the first interlevel connection structure, the second size of the horizontal cross-section of the first interlevel connection structure being larger than twice a size of the first linear-shaped gate electrode level structure as measured in the second direction, the first interlevel connection structure positioned in a substantially centered manner on the first linear-shaped gate electrode level structure relative to the second direction, the first interlevel connection structure positioned in a substantially centered manner on the first linear-shaped interconnect level structure relative to the first direction;
a second interlevel connection structure having a rectangular-shaped horizontal cross-section defined by a first size as measured in the first direction and a second size as measured in the second direction, the second size of the horizontal cross-section of the second interlevel connection structure being at least twice the first size of the horizontal cross-section of the second interlevel connection structure, the second interlevel connection structure positioned in a substantially centered manner on the second linear-shaped interconnect level structure relative to the first direction, the second interlevel connection structure positioned in a substantially centered manner on a position located one-half of the gate electrode pitch as measured in the second direction away from the lengthwise-oriented centerline of the first linear-shaped gate electrode level structure;
a third interlevel connection structure having a rectangular-shaped horizontal cross-section defined by a first size as measured in the first direction and a second size as measured in the second direction, the second size of the horizontal cross-section of the third interlevel connection structure being at least twice the first size of the horizontal cross-section of the third interlevel connection structure, the third interlevel connection structure positioned in a substantially centered manner on the third linear-shaped interconnect level structure relative to the first direction, the third interlevel connection structure positioned in a substantially centered manner on a position located one-half of the gate electrode pitch as measured in the second direction away from the lengthwise-oriented centerline of the first linear-shaped gate electrode level structure, such that the second and third interlevel connection structures are located on different sides of the first linear-shaped gate electrode level structure relative to the second direction.

2. The semiconductor device as recited in claim 1, wherein the first size of the horizontal cross-section of at least one of the first, second, and third interlevel connection structures is minimally sized within design rule requirements pertaining to a semiconductor chip.

3. The semiconductor device as recited in claim 1, wherein the first size of the horizontal cross-section of the first interlevel connection structure is substantially equal to a minimum transistor channel length allowed by design rule requirements pertaining to a semiconductor chip.

4. The semiconductor device as recited in claim 1, wherein the second size of the horizontal cross-section of at least one of the first, second, and third interlevel connection structures is larger than a maximum size allowed by design rule for a contact structure.

5. The semiconductor device as recited in claim 1, wherein the first interlevel connection structure corresponds to a conductive via structure defined to physically connect to both the first linear-shaped gate electrode level structure and the first linear-shaped interconnect level structure.

6. The semiconductor device as recited in claim 5, wherein the second interlevel connection structure corresponds to a conductive diffusion contact structure defined to physically connect to both the second linear-shaped interconnect level structure and a first diffusion region of the first transistor.

7. The semiconductor device as recited in claim 6, wherein the third interlevel connection structure corresponds to a conductive diffusion contact structure defined to physically connect to both the third linear-shaped interconnect level structure and a second diffusion region of the first transistor.

8. The semiconductor device as recited in claim 7, wherein the second diffusion region of the first transistor is also a first diffusion region of the second transistor.

9. The semiconductor device as recited in claim 8, wherein each of the first, second, and third linear-shaped interconnect level structures has a respective lengthwise-oriented centerline oriented in the second direction,
wherein the lengthwise-oriented centerline of the first linear-shaped interconnect level structure is separated from the lengthwise-oriented centerline of the second linear-shaped interconnect level structure by an interconnect pitch as measured in the first direction,
wherein the lengthwise-oriented centerline of the third linear-shaped interconnect level structure is separated from the lengthwise-oriented centerline of the second linear-shaped interconnect level structure by the interconnect pitch as measured in the first direction.

10. The semiconductor device as recited in claim 9, wherein the second size of the horizontal cross-section of the second interlevel connection structure is substantially equal to the second size of the horizontal cross-section of the third interlevel connection structure.

11. The semiconductor device as recited in claim 9, wherein the first size of the horizontal cross-section of the first interlevel connection structure is less than a size of the first linear-shaped interconnect level structure as measured in the first direction.

12. The semiconductor device as recited in claim 11, wherein the first size of the horizontal cross-section of the second interlevel connection structure is less than a size of the second linear-shaped interconnect level structure as measured in the first direction.

13. The semiconductor device as recited in claim 12, wherein the first size of the horizontal cross-section of the third interlevel connection structure is less than a size of the third linear-shaped interconnect level structure as measured in the first direction.

14. The semiconductor device as recited in claim 9, wherein the first, second, and third interlevel connection structures are spaced apart from each other in the first direction.

15. The semiconductor device as recited in claim 9, wherein the first interlevel connection structure is not positioned directly over the first diffusion region of the first transistor, and
wherein the first interlevel connection structure is not positioned directly over the second diffusion region of the first transistor.

16. The semiconductor device as recited in claim 9, wherein the first linear-shaped gate electrode level structure has at least one end substantially aligned in the first direction with at least one end of the second linear-shaped gate electrode level structure.

17. The semiconductor device as recited in claim 16, wherein the first linear-shaped gate electrode level structure has at least one end not aligned in the first direction with at least one end of the second linear-shaped gate electrode level structure.

18. The semiconductor device as recited in claim 1, wherein the first linear-shaped gate electrode level structure has at least one end substantially aligned in the first direction with at least one end of the second linear-shaped gate electrode level structure.

19. The semiconductor device as recited in claim 18, wherein each of the first, second, and third linear-shaped interconnect level structures has a respective lengthwise-oriented centerline oriented in the second direction,
wherein the lengthwise-oriented centerline of the first linear-shaped interconnect level structure is separated from the lengthwise-oriented centerline of the second linear-shaped interconnect level structure by an interconnect pitch as measured in the first direction,
wherein the lengthwise-oriented centerline of the third linear-shaped interconnect level structure is separated from the lengthwise-oriented centerline of the second linear-shaped interconnect level structure by the interconnect pitch as measured in the first direction.

20. The semiconductor device as recited in claim 19, wherein the first size of the horizontal cross-section of the first interlevel connection structure is less than a size of the first linear-shaped interconnect level structure as measured in the first direction.

21. The semiconductor device as recited in claim 20, wherein the second size of the horizontal cross-section of the second interlevel connection structure is substantially equal to the second size of the horizontal cross-section of the third interlevel connection structure.

22. The semiconductor device as recited in claim 21, wherein the first linear-shaped gate electrode level structure has at least one end not aligned in the first direction with at least one end of the second linear-shaped gate electrode level structure.

23. A method for manufacturing a semiconductor device, comprising:
forming a first linear-shaped gate electrode level structure, the first linear-shaped gate electrode level structure configured to form a gate electrode of a first transistor, the first linear-shaped gate electrode level structure oriented to extend lengthwise in a first direction;
forming a second linear-shaped gate electrode level structure, the second linear-shaped gate electrode level structure configured to form a gate electrode of a second transistor, the second linear-shaped gate electrode level structure oriented to extend lengthwise in the first direction, wherein the first and the second linear-shaped gate electrode level structures are positioned next to each other such that their respective lengthwise-oriented centerlines are separated from each other by a gate electrode pitch as measured in a second direction perpendicular to the first direction;

forming a first linear-shaped interconnect level structure, the first linear-shaped interconnect level structure configured to extend lengthwise in the second direction over both the first linear-shaped gate electrode level structure and the second linear-shaped gate electrode level structure;

forming a second linear-shaped interconnect level structure, the second linear-shaped interconnect level structure configured to extend lengthwise in the second direction over both the first linear-shaped gate electrode level structure and the second linear-shaped gate electrode level structure;

forming a third linear-shaped interconnect level structure, the third linear-shaped interconnect level structure configured to extend lengthwise in the second direction over both the first linear-shaped gate electrode level structure and the second linear-shaped gate electrode level structure;

forming a first interlevel connection structure, the first interlevel connection structure having a rectangular-shaped horizontal cross-section defined by a first size as measured in the first direction and a second size as measured in the second direction, the second size of the horizontal cross-section of the first interlevel connection structure being at least twice the first size of the horizontal cross-section of the first interlevel connection structure, the second size of the horizontal cross-section of the first interlevel connection structure being larger than twice a size of the first linear-shaped gate electrode level structure as measured in the second direction, the first interlevel connection structure positioned in a substantially centered manner on the first linear-shaped gate electrode level structure relative to the second direction, the first interlevel connection structure positioned in a substantially centered manner on the first linear-shaped interconnect level structure relative to the first direction;

forming a second interlevel connection structure, the second interlevel connection structure having a rectangular-shaped horizontal cross-section defined by a first size as measured in the first direction and a second size as measured in the second direction, the second size of the horizontal cross-section of the second interlevel connection structure being at least twice the first size of the horizontal cross-section of the second interlevel connection structure, the second interlevel connection structure positioned in a substantially centered manner on the second linear-shaped interconnect level structure relative to the first direction, the second interlevel connection structure positioned in a substantially centered manner on a position located one-half of the gate electrode pitch as measured in the second direction away from the lengthwise-oriented centerline of the first linear-shaped gate electrode level structure;

forming a third interlevel connection structure, the third interlevel connection structure having a rectangular-shaped horizontal cross-section defined by a first size as measured in the first direction and a second size as measured in the second direction, the second size of the horizontal cross-section of the third interlevel connection structure being at least twice the first size of the horizontal cross-section of the third interlevel connection structure, the third interlevel connection structure positioned in a substantially centered manner on the third linear-shaped interconnect level structure relative to the first direction, the third interlevel connection structure positioned in a substantially centered manner on a position located one-half of the gate electrode pitch as measured in the second direction away from the lengthwise-oriented centerline of the first linear-shaped gate electrode level structure, such that the second and third interlevel connection structures are located on different sides of the first linear-shaped gate electrode level structure relative to the second direction.

* * * * *